(12) United States Patent
Wu et al.

(10) Patent No.: US 7,943,983 B2
(45) Date of Patent: May 17, 2011

(54) HTO OFFSET SPACERS AND DIP OFF PROCESS TO DEFINE JUNCTION

(75) Inventors: Huaqiang Wu, Burlingame, CA (US); Hiro Kinoshita, San Jose, CA (US); Ning Cheng, San Jose, CA (US); Arturo Ruiz, San Jose, CA (US); Jihwan Choi, San Mateo, CA (US)

(73) Assignee: Spansion LLC, Sunnyvale, CA (US)

( * ) Notice: Subject to any disclaimer, the term of this patent is extended or adjusted under 35 U.S.C. 154(b) by 217 days.

(21) Appl. No.: 12/342,011

(22) Filed: Dec. 22, 2008

(65) Prior Publication Data

US 2010/0155785 A1 Jun. 24, 2010

(51) Int. Cl.
*H01L 21/336* (2006.01)
*H01L 27/115* (2006.01)

(52) U.S. Cl. ......... 257/324; 257/E21.679; 257/E27.103; 438/257

(58) Field of Classification Search .................. 257/324, 257/390, E21.679, E27.081, E27.103; 438/257, 438/261, 300, 301
See application file for complete search history.

(56) References Cited

U.S. PATENT DOCUMENTS
2007/0045720 A1* 3/2007 Kouketsu et al. ............. 257/324
* cited by examiner

*Primary Examiner* — Thomas L Dickey
(74) *Attorney, Agent, or Firm* — Turocy & Watson, LLP

(57) ABSTRACT

Memory devices having an increased effective channel length and/or improved TPD characteristics, and methods of making the memory devices are provided. The memory devices contain two or more memory cells on a semiconductor substrate and bit line dielectrics between the memory cells. The memory cell contains a pair of first bit lines and a pair of second bit lines. The first and second bit lines can be formed by an implant process using first and second spacers that have different lateral lengths from each other. The spacers can be used to offset the implants, thereby controlling the lateral lengths of the bit lines.

20 Claims, 11 Drawing Sheets

US 7,943,983 B2

HTO OFFSET SPACERS AND DIP OFF PROCESS TO DEFINE JUNCTION

TECHNICAL FIELD

Described are memory devices having an improved effective channel length (Leffective) and/or improved transport program disturb (TPD) characteristics, methods of forming memory devices, and methods of increasing an effective channel length in memory cells.

BACKGROUND

Modern computing devices utilize a variety of kinds of memory devices to store and access information. Memory devices include general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, and the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as word lines and the array columns are referred to as bit lines.

The trend in semiconductor memory devices has been toward higher circuit density with higher numbers of bit cells per device, lower operating voltages, and higher access speeds. To achieve the high densities there have been, and continue to be, efforts toward scaling down device dimensions (e.g., at sub-micron levels). However, as scaling down device dimensions, hot electrons generated during programming a memory cell may reach adjacent memory cells and disturb programming the adjacent memory cells (e.g., TPD). Thus, the requirement of small features with close spacing between adjacent features requires sophisticated manufacturing techniques without suffering an effective channel length.

SUMMARY

The following presents a simplified summary of the innovation disclosed herein in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

One aspect of the subject innovation provides methods of making memory devices. Another aspect of the subject innovation provides methods of increasing an effective channel length in memory cells. The methods can involve providing features and bit line openings therebetween on a semiconductor substrate, and pocket implant regions in the semiconductor substrate adjacent and under the features. The feature can contain a charge trapping dielectric stack and a poly gate.

The methods can further involve forming first spacers adjacent side surfaces of the features and in the bit line openings, thereby forming first openings, and then forming first bit lines in the semiconductor substrate under the first openings by using the first spacers as an implant screen. The lateral length of the first spacers can be decreased, thereby forming second spacers and second openings. Second bit lines can be formed in the semiconductor substrate under the second opening.

Yet another aspect of the subject innovation provides memory devices having an improved effective channel length and/or improved TPD characteristics. The memory devices contain two or more memory cells and bit line openings therebetween on a semiconductor substrate. The memory cell contains a charge trapping dielectric stack and a poly gate on the semiconductor substrate and two pocket implant regions in the semiconductor substrate adjacent and under the charge trapping dielectric stack. The memory device further contains bit line dielectrics in the bit line openings and first and second bit lines in the semiconductor substrate under the bit line openings. The first bit lines have a higher concentration of dopants compared to a concentration of dopants of the second bit lines and a lateral length of the first bit lines is smaller than a lateral length of the second bit lines.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation may be employed. Other objects, advantages and novel features of the innovation will become apparent from the following detailed description of the innovation when considered in conjunction with the drawings.

DETAILED DESCRIPTION

Figure 1:
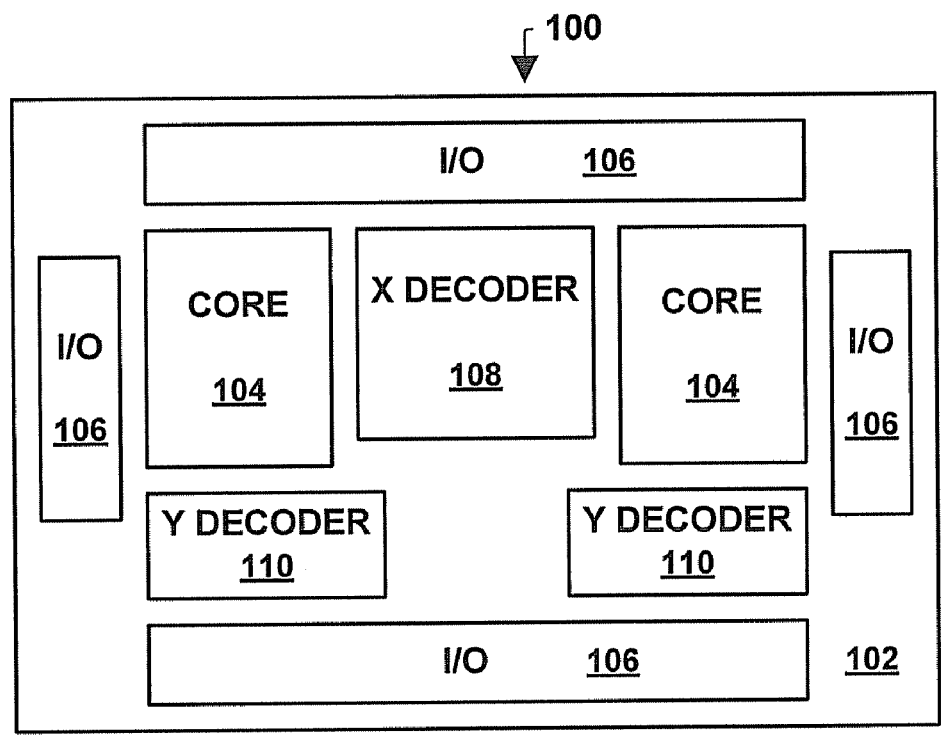
FIG. 1 is a top view of an exemplary memory device in accordance with an aspect of the subject innovation.

The device and method described herein can improve the scalability of, for example, a single-bit, double-bit, or multi-bit charge trapping dielectric flash memory device, by allowing for a greater effective channel length. A greater effective channel length can provide improved charge separation in memory cells, a reduction in complementary bit disturb effects, as well as improved drain-source break down voltage (BVdss) characteristic. This greater effective channel length can be accomplished due to a decreased lateral dimension for a diffusion region of each bit line.

A memory cell is generally programmed by applying a relatively high voltage to a control gate and connecting a source to ground and a drain to a predetermined potential above the source. During the programming of memory cells, hot electrons in a core cell channel region tunnel through a gate oxide into the floating gate and become trapped in the floating gate since the floating gate is surrounded by an interpoly dielectric and the tunnel oxide. Because of the trapped electrons, the threshold voltage of the cell increases. This change in the threshold voltage (and thereby the channel conductance) of the cell created by the trapped electrons is what causes the cell to be programmed.

The hot electrons generated during programming may be so hot that they go under bit line junction. The hot electrons may reach floating gates or storage elements of adjacent memory cells. Moreover, hot holes generated during programming may have a secondary impact ionization below a bit line region and the secondary electrons diffuse to a gate of adjacent memory cell where they are accelerated by a drain depletion region and injected into a storage element of the adjacent memory cell. As a result, due to the hot electrons and hot holes generated during programming, memory cells may suffer from a TPD phenomenon.

With memory devices shrinking in size, shorter channel lengths of the smaller devices increasingly exhibit short channel behaviour that affects program operation. As the memory cells shrink, BVdss generally reduces, resulting in increased column leakage current originated from unselected wordline cells when the same programming voltage is applied at the selected bit line. The increased leakage current may load down the bit line driver and may increase power consumption. In a worst case, the intrinsic programming voltage may be pulled down and the program efficiency may be impaired.

The subject innovation provides memory devices, methods of forming memory devices, and methods of increasing an effective channel length in memory cells. The subject innovation can provide one or more of the following advantages: an increased effective channel length, improved TPD characteristics, and improved drain-source break down voltage characteristics.

An effective channel length of a memory cell is defined between corresponding pairs of buried bit lines. In the subject innovation, the bit lines can be formed by implantation of dopants using spacers as an implant screen to offset the implants. The spacers constrain the implant in a narrower implant region, thereby increasing an effective channel length of the memory cell. The spacers can also allow the bit line implant with higher energy and/or higher dose without suffering device short channel roll off issues. Higher energy bit line implant can form a deeper bit line junction and can effectively block hot electron move to the adjacent memory cell and prevent TPD. The deeper bit line can also prevent or mitigate bitline-to-bitline current leakage and increase BVdss.

In the subject innovation, two or more pairs of bit lines can be formed in a semiconductor substrate for a memory cell by using two or more of pairs of spacers that have different lateral lengths from each other. Since the spacers can serve as an implant screen, when the spacers have a greater lateral length, the resultant bit lines have a smaller lateral length. When the spacers have a smaller lateral length, the resultant bit lines have a greater lateral length. Changing the lateral length of the spacers, the lateral length of the bit line can be controlled.

First bit lines can be formed in a semiconductor substrate by implantation of dopants using first spacers as an implant screen to offset the implants. After forming the first bit lines, the lateral length of the first spacers are decreased, for example, by etching, thereby forming second spacers and second openings. The lateral length of the second spacers is smaller than the lateral length of the first spacers.

Second bit lines can be formed in the semiconductor substrate by implantation of dopants using the second spacers as an implant screen to offset the implants. Since the lateral length of the second spacer is smaller than the lateral length of the first spacer, the resultant second bit line has a greater lateral length compared to the lateral length of the first bit line.

The first bit line can be formed by single implant or two implants using the first spacer having the larger lateral length. In one embodiment, the first bit line is formed by one implant with high energy. In another embodiment, the first bit line is formed by a first high energy implant and a second low energy implant. The second bit line can be formed by one low energy implant using the second spacer having the smaller lateral length.

The two or more implants using different lateral lengths of spacers can address different device characteristics. For example, the first high energy implant for the first bit line can prevent a TPD phenomenon. The second low energy implant for the first bit line can reduce the bit line resistance. The low energy implant for the second bit line can ensure that a bit line is formed in the semiconductor substrate for a memory cell and control a length of gate overlap (e.g., drain/source gate overlap) for the device programming. Using different lateral lengths of spacers allows the subject innovation to optimize the device performance.

In one embodiment, after forming the second bit lines, the lateral length of the second spacers is decreased, thereby forming third spacers. Third bit lines can be formed by implantation of dopants using the third spacers as an implant screen to offset the implants. Since the lateral length of the third spacers is smaller than the lateral length of the second spacers, the resultant third bit line has a greater lateral length compared to the lateral length of the second bit line. The third bit line can be formed by a low energy implant to ensure that a bit line is formed in the semiconductor substrate for a memory cell and control a length of gate overlap for the device programming.

The subject innovation described herein can be applied to any suitable type of memory cell. For example, the subject innovation can be applied to single-level memory cells, multi-level memory cells, single-bit memory cells, dual-bit memory cells, quad-bit memory cells, multi-bit memory cells, and the like. The dual-bit memory is a relatively modern memory technology and allows multiple bits to be stored in a single memory cell. The dual-bit memory cell is essentially split into two identical (mirrored) parts, each of which is formulated for storing one of two independent bits. Each dual-bit memory cell, like a traditional cell, has a gate with a source and a drain. However, unlike a traditional stacked gate cell in which the source is always connected to an electrical source and the drain is always connected to an electrical drain, respective dual-bit memory cells can have the connections of the source and drain reversed during operation to permit storage of two bits.

A dual-bit memory cell can have a semiconductor substrate with implanted conductive bit lines. The dual-bit memory cell contains a charge trapping dielectric stack that can contain one or more layers and can be formed over the semiconductor substrate. For example, the charge trapping dielectric stack can contain three separate layers: a first insulating layer, a charge trapping dielectric layer, and a second insulating layer. Word lines are formed over the charge trapping dielectric stack substantially perpendicular to the bit lines. Programming circuitry controls two bits per cell by applying a signal to the word line, which acts as a control gate, and changing bit line connections such that one bit is stored by source and drain being connected in one arrangement and a complementary bit is stored by the source and drain being interchanged in another arrangement.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

Although the subject innovation can be applied to any type of memory cell, the innovation is hereinafter illustrated and described in the context of an exemplary semiconductor device having one or more memory arrays containing dual-bit memory cells arranged in a virtual ground type array architecture. FIG. 1 illustrates a top view of an exemplary dual-bit flash memory device 100. The memory device 100 generally includes a semiconductor substrate 102 in which one or more high-density core regions 104 and one or more lower-density peripheral portions are formed. The high-density core regions 104 typically include one or more M by N arrays of individually addressable, substantially identical dual-bit memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations). The memory device 100 contains memory cells that are described in connection with FIGS. 4-21.

Figure 2:
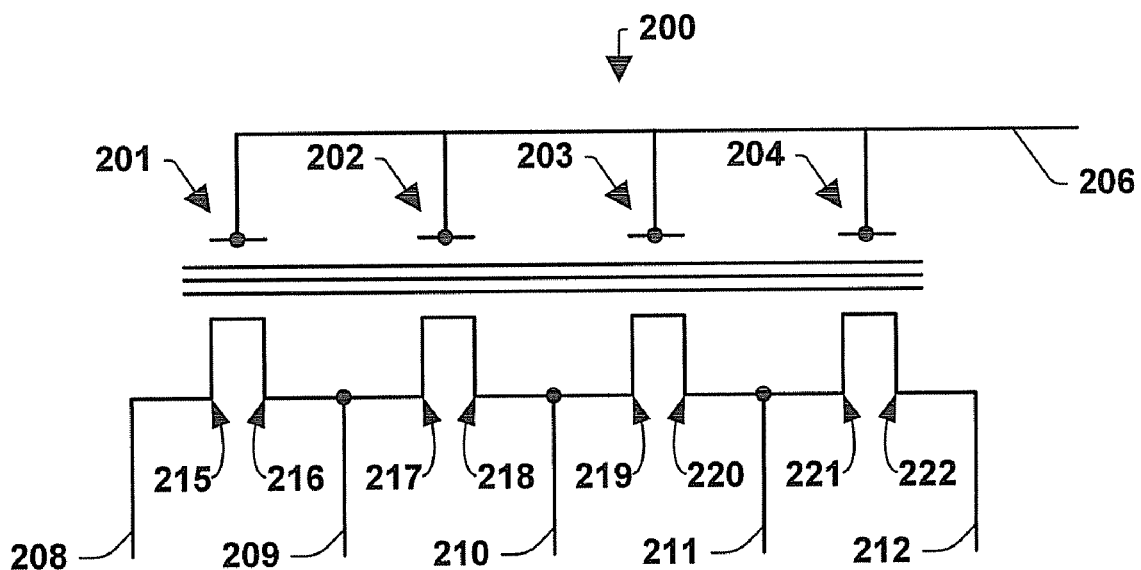
FIG. 2 is a schematic illustration of a portion of a memory core such as may include at least part of one of the cores depicted in FIG. 1 in a virtual ground type configuration in accordance with an aspect of the subject innovation.

FIG. 2 is a schematic illustration of a portion 200 of an exemplary memory core such as may include at least a part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a word line 206, which serves as a control gate, and pairs of the memory cells share a common bit line. For instance, in the example shown, the memory cell 201 associates bit lines 208 and 209; the memory cell 202 associates bit lines 209 and 210; the memory cell 203 associates bit lines 210 and 211; and the memory cell 204 associates bit lines 211 and 212. As such, cells 201 and 202 share bit line 209, cells 202 and 203 share bit line 210 and cells 203 and 204 share bit line 211, respectively. The memory cells 201 through 204 are described in connection with FIGS. 4-21.

Depending upon a signal on the word line and the connection of the bit lines in a memory cell to an electrical source or drain, the memory cells 201 through 204 are capable of writing, reading, and erasing bits at locations 215 through 222. For example, control of the bit at location 215 is achieved through connection of the drain to the bit line 208 and the source to the bit line 209. Similarly, control of the bit at location 216 is achieved through connection of the drain to the bit line 209 and the source to the bit line 208. It will be appreciated that although adjacent memory cells share common bit lines, the adjacent memory cells do not interfere with each other because the memory cells are typically programmed one at a time and in such instances only one memory cell is active at a time while programming.

Figure 3:
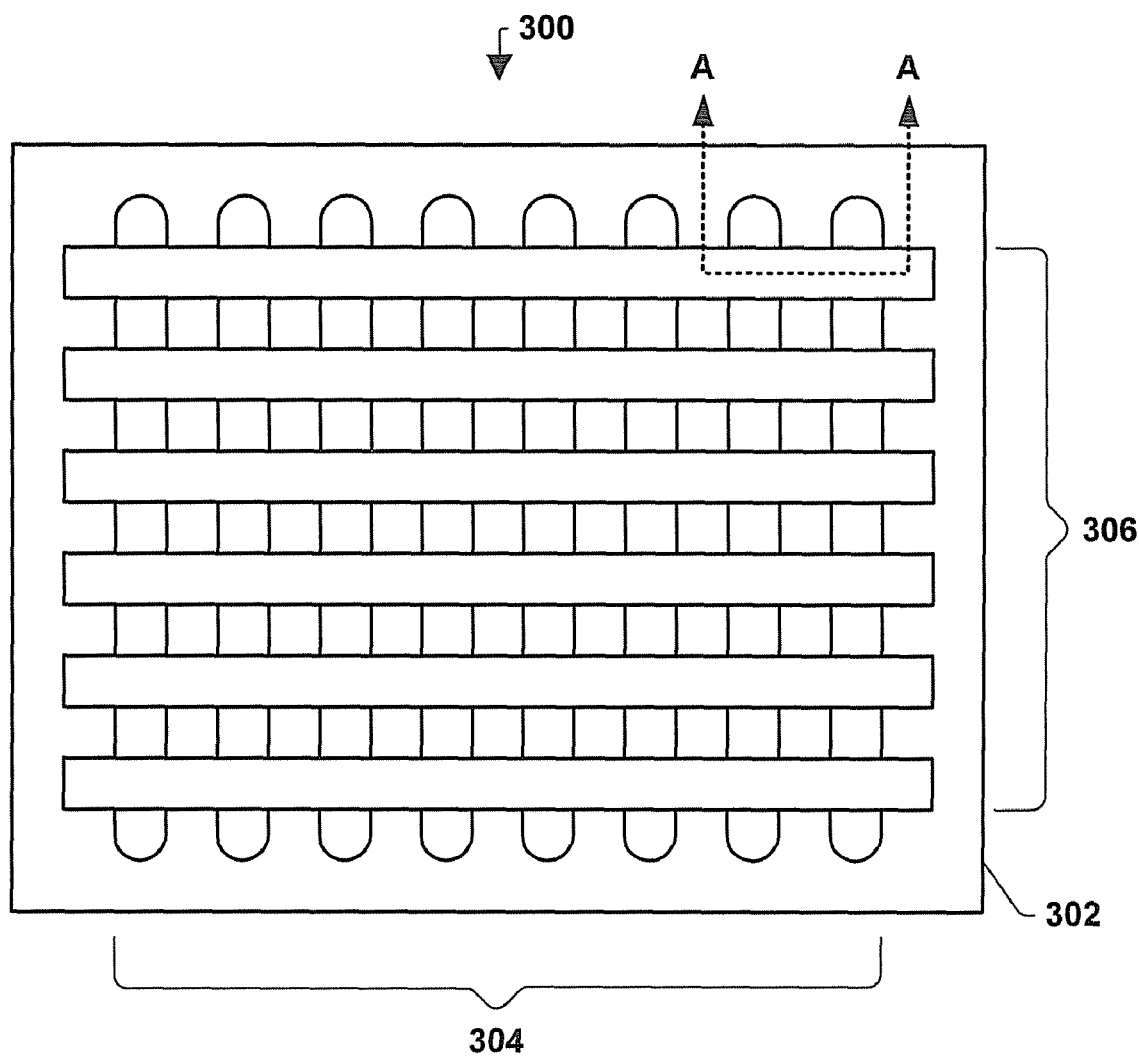
FIG. 3 is a top view of at least a portion of a memory core, such as may include at least a part of one of the cores depicted in FIG. 1 in accordance with an aspect of the subject innovation.

FIG. 3 illustrates a top view of at least a portion 300 of a memory core, such as may include at least part of one of the M by N array cores 104 depicted in FIG. 1. The memory 300 is formed upon a semiconductor substrate 302 and has a plurality of implanted bit lines 304 extending substantially parallel to one another, and further includes a plurality of formed word lines 306 extending substantially in parallel to one another and at substantially right angles to the plurality of implanted bit lines 304. It will be appreciated that the word lines 306 and bit lines 304 have contacts and interconnections (e.g., bit line junctions, not shown) to programming circuitry such as may be represented, at least in part, by x-decoders and y-decoders. The memory core 300 contains memory cells that are described in connection with FIGS. 4-21.

Figure 4:
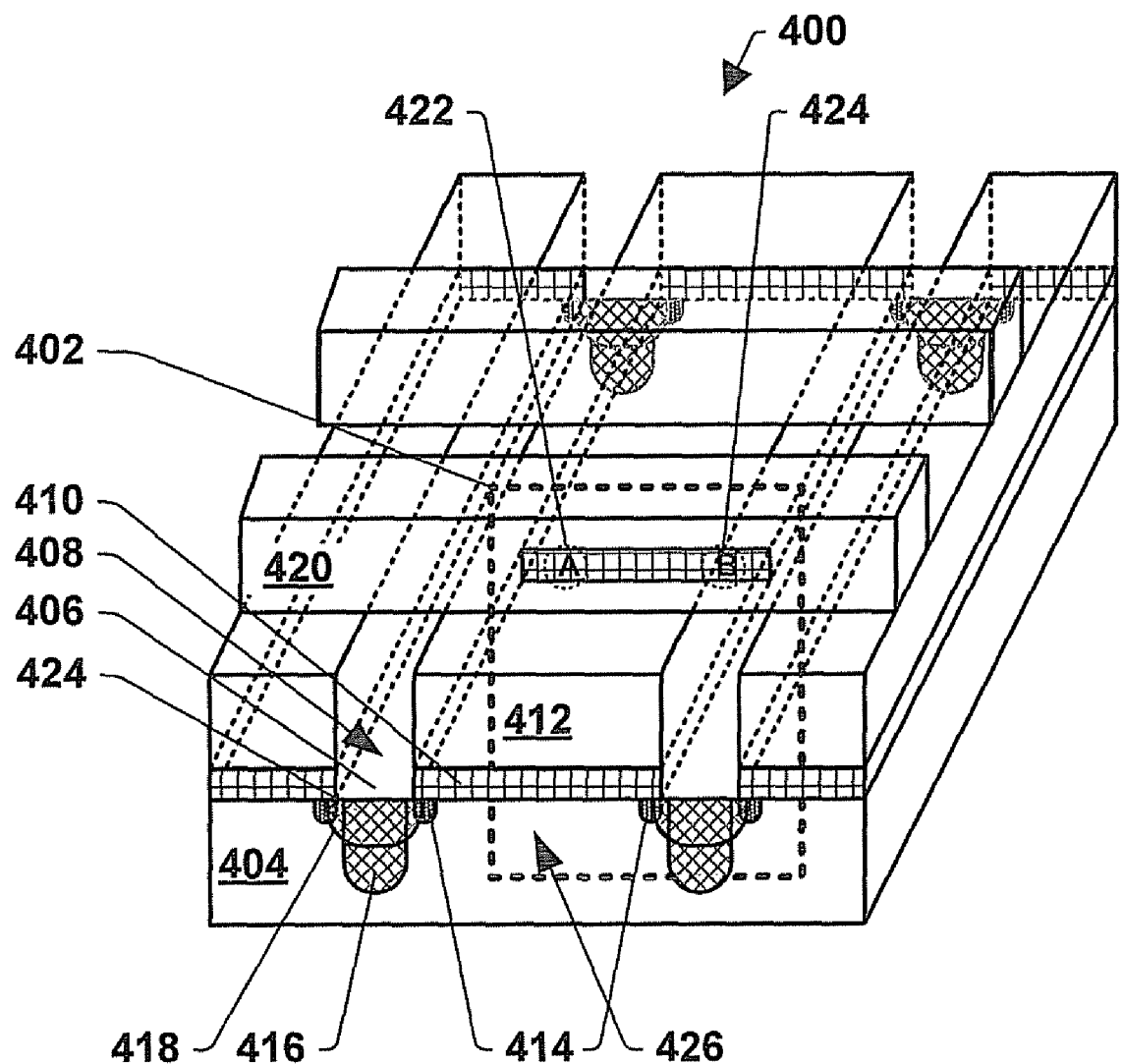
FIG. 4 is a cross-sectional isometric illustration of exemplary memory cells, such as that taken along a line A-A of FIG. 3 in accordance with an aspect of the subject innovation.

FIG. 4 is a cross-sectional isometric illustration of a portion of a memory device 400 containing a dual-bit memory cell 402 as indicated by a dashed line, such as that taken along a line A-A of FIG. 3. The dual-bit memory cell 402 is formed on a semiconductor substrate 404. The memory cell 402 is separated from adjacent memory cells by bit line dielectrics 406 in bit line openings 408. In one embodiment, the bit line dielectric does not extend into the semiconductor substrate.

The memory cell 402 contains a charge trapping dielectric stack 410; a poly gate 412 on the charge trapping dielectric stack 410; two pocket implant regions 414 in the semiconductor substrate 404 adjacent and under the charge trapping dielectric stack 410; two first bit lines 416 in the semiconductor substrate 404 adjacent the charge trapping dielectric stack 410 and under the bit line openings 408; two second bit lines 418 in the semiconductor substrate 404 adjacent the charge trapping dielectric stack 410 and under the bit line openings 408; and a word line 420.

The charge trapping dielectric stack 410 can contain two charge storage nodes that can store at least a bit of information, respectively. For example, the memory cell 402 is capable of storing two spatially separated binary data bits, including a left bit 422 represented by the dashed circle A and a right bit 424 represented by the dashed circle B. When the memory cell 402 is such a dual-bit memory cell, the dual-bit memory cell is generally symmetrical, wherein a drain and a source are interchangeable, although asymmetric implementations are possible within the scope of the innovation. In one embodiment, the two charge storage nodes 422, 424 are physically separated by a central dielectric (not shown) in the charge trapping dielectric stack 410. In another embodiment, the two charge storage nodes are not physically separated in a single charge trapping dielectric stack.

The first and second bit lines 416, 418 typically contain implanted n-type materials, such as arsenic, and may include an oxide portion (not shown) in some examples. Each pair of first and second bit lines 416, 418 is spaced apart and defines a channel region 426 therebetween. The channel 426 can have an effective channel length and the bits 422, 424 can be stored apart from each other in the charge trapping dielectric stack 410.

The first bit lines 416 have a higher concentration of dopants compared to a concentration of dopants of the second bit lines 418. The depth of the first bit lines 416 is greater than the depth of the second bit lines 418. The lateral length of the first bit lines 416 is smaller than the lateral length of the second bit lines 418. In one embodiment, the first bit line 416 does not overlap with the poly gate 412 in the lateral direction, but a portion of the second bit line 418 overlaps with a portion of the poly gate 412 in the lateral direction. In another embodiment, the first bit line 416 does not overlap with the pocket implant region 414, but a portion of the second bit line 418 overlaps with a portion of the pocket implant region 414.

Although not shown, the memory cell 402 can have third bit lines in the semiconductor substrate 404 under the bit line openings 408. The third bit lines can have a lower concentration of dopants compared to a concentration of dopants of the second bit lines 418. The depth of the third bit lines is smaller than the depth of the second bit lines 418. The lateral length of the third bit lines is greater than the lateral length of the second bit lines 418. In one embodiment, the first bit line 416 does not overlap with the poly gate 412 in the lateral direction, but a portion of the third bit line overlaps with a portion of the poly gate 412 in the lateral direction. In another embodiment, the first bit line 416 does not overlap with the pocket implant region 414, but a portion of the third bit line overlaps with a portion of the pocket implant region 414.

In the exemplary memory cell 402, the left first and second bit lines 416, 418 may serve as the source terminal and the right first and second bit lines 416, 418 as the drain terminal with respect to the right bit 424. Likewise, the right first and second bit lines 416, 418 may serve as the source terminal and the left first and second bit lines 416, 418 as the drain terminal for the left bit 422. The subject innovation may be implemented in association with various single or multi-bit memory cell types including a SONOS cell. In addition, the innovation is applicable to such dual-bit memory devices wherein both bits are used for data or information storage, as well as those in which only one bit (e.g., bit A or bit B) of the dual-bit cell is so used.

Since the memory cell 402 has the two charge storage nodes 422, 424, the memory cell 402 can store two physically distinct bits. Each bit within the memory cell 402 serves as a binary unit of data (e.g., either 1 or 0) that can be mapped directly to a memory array. Reading or programming one side of charge storage nodes 422, 424 can occur independently of whatever data is stored on the opposite side of the charge storage nodes 422, 424.

The memory device 400 can contain word lines 420 over the charge trapping dielectric stack 410. Any number of such word lines can be formed over the charge trapping dielectric stack 410 and such word lines may correspond to the word lines 306 depicted in FIG. 3. The word lines can contain a polysilicon material, for example, where the polysilicon material may be deposited over the charge trapping dielectric stack 410 and then patterned and etched.

Figure 5:
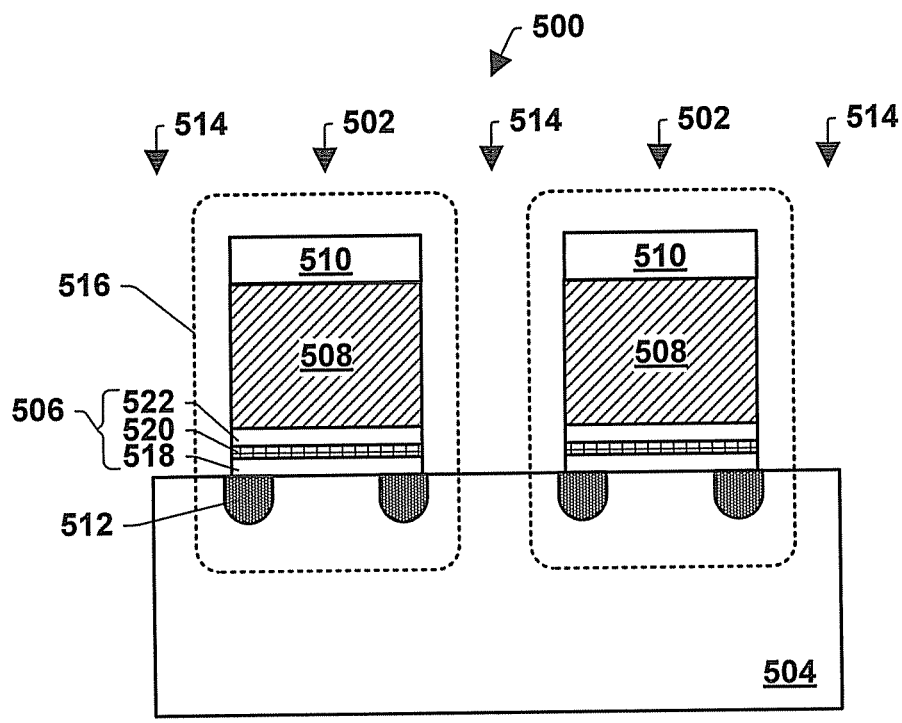
FIGS. 5-12 illustrate an exemplary method for making a memory device in accordance with an aspect of the subject innovation.

Referring to FIGS. 5 to 12 and FIGS. 13-19, two of many possible exemplary embodiments of forming memory devices are specifically illustrated. FIG. 5 illustrates a cross sectional view of an intermediate state of a portion of an exemplary memory device 500. The memory device 500 can contain one or more features 502 on a semiconductor substrate 504. The features 502 can contain a charge trapping dielectric stack 506, a poly layer 508, and a first mask layer 510. The memory device can further contains two pocket implant regions 512 in the semiconductor substrate 504 adjacent and under the charge trapping dielectric stack. Each pocket implant region 512 is located in the semiconductor substrate 504 under the side surface of the features 502.

The memory device 500 has bit line openings 514 between the features 502. A memory cell is formed in the subsequent processes at a position indicated by a dashed line 516. For simplicity of illustration in FIG. 5, two features 502 and three bit line openings 514 are shown. However, the memory device 500 can have any suitable number of features and openings. For example, the memory device 500 can have a M×N array of features 502 with M rows and N columns.

The semiconductor substrate 504 may contain any suitable semiconductor material on which electric devices such as memory cell transistors can be formed. Examples of semiconductor materials include silicon, gallium arsenide, indium phosphide, and the like.

The charge trapping dielectric stack 506 is formed over the semiconductor substrate 504. The configuration and/or constituent of the charge trapping dielectric stack 506 may vary and are not critical to the subject innovation. For example, the charge trapping dielectric stack can contain a central dielectric to contain physically separated two charge storage nodes (not shown). In another embodiment, the two charge storage nodes are not physically separated in a charge trapping dielectric stack.

Further, the charge trapping dielectric stack 506 can contain any suitable number of layers. For purposes of this discussion, the charge trapping dielectric stack 506 is described below in terms of three separate layers. However, it is to be appreciated that the charge trapping dielectric stack can include greater than or fewer than three dielectric or non-conductive layers without departing from the scope of the subject innovation.

The exemplary charge trapping dielectric stack 506 contains three separate layers: a first insulating layer 518, a charge trapping dielectric layer 520, and a second insulating layer 522. The charge trapping dielectric layer can contain any suitable dielectric material as long as the material can trap charges. Examples of charge trapping dielectric materials include nitrides (e.g., silicon nitride, silicon oxynitride, and silicon rich nitride), oxides, silicates, a high-k dielectric, for example, having a dielectric constant higher than that of silicon dioxide ($SiO_2$), and the like. In one embodiment, the charge trapping dielectric material contains silicon nitride, silicon oxynitride, and/or silicon rich nitride. In another example, the charge trapping dielectric material contains oxides or silicates containing Al, Ta, Hf, La, Zr, Ti, Nb, Cr, V, Y, Ce, and/or Pr.

The first and second insulating layers 518 and 522 typically contain oxide dielectrics such as silicon dioxide ($SiO_2$) and the charge trapping dielectric layer 520 typically contains nitride dielectrics such as silicon nitride ($Si_xN_y$). The oxide-nitride-oxide configuration may be referred to as an ONO layer. Especially, when the nitride layer contains silicon rich nitride, the first oxide layer, nitride layer, and second oxide layer may be referred to as an ORO tri-layer.

Specific examples of other charge trapping dielectric stacks include an oxide/nitride bi-layer, a nitride/oxide bi-layer, an oxide/tantalum oxide bi-layer ($SiO_2/Ta_2O_5$), an oxide/tantalum oxide/oxide tri-layer ($SiO_2/Ta_2O_5/SiO_2$), an oxide/strontium titanate bi-layer ($SiO_2/SrTiO_3$), an oxide/barium strontium titanate bi-layer ($SiO_2/BaSrTiO_2$), an oxide/strontium titanate/oxide tri-layer ($SiO_2/SrTiO_3/SiO_2$), an oxide/strontium titanate/barium strontium titanate tri-layer ($SiO_2/SrTiO_3/BaSrTiO_2$), and the like. In another embodiment, the charge trapping dielectric stack can contain five separate layers, for example, oxide-nitride-polysilicon-nitride-oxide. The oxide-nitride-polysilicon-nitride-oxide configuration may be referred to as an ORPRO layer when the nitride layer contains silicon rich nitride.

The charge trapping dielectric stack 506 can be formed by any suitable technique. For example, the charge trapping dielectric stack 506 can be formed by CVD, lithography, and etching techniques. The oxide-nitride-oxide tri-layer can be fabricated by forming a first silicon oxide layer, forming a silicon nitride layer on the first silicon oxide layer, and forming a second silicon oxide layer on the silicon nitride layer. The first oxide layer can be formed on surfaces of the semiconductor substrate 504 by, for example, oxidation techniques (e.g., thermal oxidation, plasma-assisted oxidation, and the like) and/or deposition techniques (e.g., CVD, spin-on techniques, and the like). A nitride layer is formed on the first oxide layer by, for example, deposition techniques (e.g., CVD, spin-on techniques, and the like). The second oxide layer can be formed in the same manner as the first oxide layer.

The heights of the first oxide layer 518 and second oxide layer 522 may vary and are not critical to the subject innovation. The first oxide layer and second oxide layer have independently any suitable height that depends on the desired implementations of the semiconductor structure 500 being fabricated. In one embodiment, the heights of the first oxide layer and second oxide layer are independently about 1 nm or more and about 10 nm or less. In another embodiment, the heights of the first oxide layer and second oxide layer are independently about 2 nm or more and about 8 nm or less. In yet another embodiment, the heights of the first oxide layer and second oxide layer are independently about 3 nm or more and about 7 nm or less. In still yet another embodiment, the heights of the first oxide layer and second oxide layer are about 5 nm.

The height of the nitride layer 520 may vary and is not critical to the subject innovation. The nitride layer has any suitable height that depends on the desired implementations of the semiconductor structure 500 being fabricated. In one embodiment, the height of the nitride layer is about 1 nm or more and about 20 nm or less. In another embodiment, the height of the nitride layer is about 2 nm or more and about 15 nm or less. In yet another embodiment, the height of the nitride layer is about 3 nm or more and about 10 nm or less. In still yet another embodiment, the height of the nitride layer is about 7 nm.

The poly layer 508 typically contains polysilicon. The height of the poly layer 508 may vary and is not critical to the subject innovation. The poly layer 508 has any suitable height that depends on the desired implementations of the semiconductor structure 500 being fabricated. In one embodiment, the height of the poly layer 508 is about 30 nm or more and about 300 nm or less. In another embodiment, the height of the poly layer 508 is about 50 nm or more and about 200 nm or less. In yet another embodiment, the height of the poly layer 508 is about 70 nm or more and about 150 nm or less. In still yet another embodiment, the height of the poly layer 508 is about 100 nm.

The first mask layer 510 may contain any suitable mask material. Examples of mask materials include oxides such as silicon oxide (e.g., silicon oxide ($Si_xO_y$) and silicon dioxide ($SiO_2$)); nitrides such as silicon nitride (e.g., silicon nitride ($Si_xN_y$), silicon rich nitride, and oxygen rich silicon nitride); and the like.

The height of the first mask layer 510 may vary and is not critical to the subject innovation. The first mask layer 510 has any suitable height that depends on the desired implementations of the semiconductor structure 500 being fabricated. In one embodiment, the height of the first mask layer 510 is about 10 nm or more and about 200 nm or less. In another embodiment, the height of the first mask layer 510 is about 20 nm or more and about 150 nm or less. In yet another embodiment, the height of the first mask layer 510 is about 30 nm or more and about 100 nm or less. In still yet another embodiment, the height of the first mask layer 510 is about 60 nm.

Although not shown, an anti-reflective coating (ARC) can be formed on the first mask layer 510 for increasing resolution of a subsequent lithography process. Any suitable ARC material can be employed. For example, ARC contains oxides such as silicon oxide; nitrides such as silicon nitride; carbides such as silicon carbide ($Si_xC_y$); amorphous carbon; and the like.

The features 502 can be formed on the semiconductor substrate by any suitable technique. For example, a charge trapping dielectric stack is formed on a semiconductor substrate, a poly layer is formed on the charge trapping dielectric stack, and a first mask layer is formed on the poly layer. The first mask layer is patterned by removing portions of the first mask layer via, for example, lithography and etching techniques, thereby forming a patterned first mask layer 510 and exposing portions of the poly layer and the charge trapping dielectric stack. The poly layer and the charge trapping dielectric stack are patterned by removing the exposed portions of the poly layer and the charge trapping dielectric stack that are not covered with the patterned first mask layer, thereby forming the patterned poly layer 508 and the patterned charge trapping dielectric stack 506.

The pocket implant regions 512 typically contain an implanted p-type material, such as boron. The pocket implant regions can facilitate controlling a threshold voltage of the memory cell. The pocket implant regions 512 can be formed in the semiconductor substrate 504 by any suitable technique. For example, the pocket implant region 512 is formed via implantation of one or more dopants at an angle with respect to the surface of the semiconductor substrate 504. The dopants pass through the bit line opening 514 and are implanted adjacent to and to a certain degree under portions of the charge trapping dielectric stack 508 depending upon the angle of implantation. The dopants can be implanted at an angle of about 5 degrees or more and about 40 degrees or less relative to the surface of the semiconductor substrate 504. Passing the dopants through the bit line opening between the features with a certain degree, the resultant pocket implant regions are located in the semiconductor substrate under the side surfaces of the features.

Any suitable implant compositions and concentrations for the pocket implants can be employed. For example, the dopants include one or more p-type dopants, such as boron. Such dopants can be implanted at an energy level of about 3 KeV or more and about 30 KeV or less and a dose of about $1E12$ atoms/cm$^2$ or more and $5E15$ atoms/cm$^2$ or less, for example.

While FIG. 5 illustrates the exemplary method of forming features on a semiconductor substrate, the details of the structure and manufacture of the features are not critical to the subject innovation. The details of the structure and manufacture of the features can be found in, for example, commonly-assigned U.S. Pat. No. 7,157,335, issued Jan. 2, 2007, which is hereby incorporated by reference.

Figure 6:
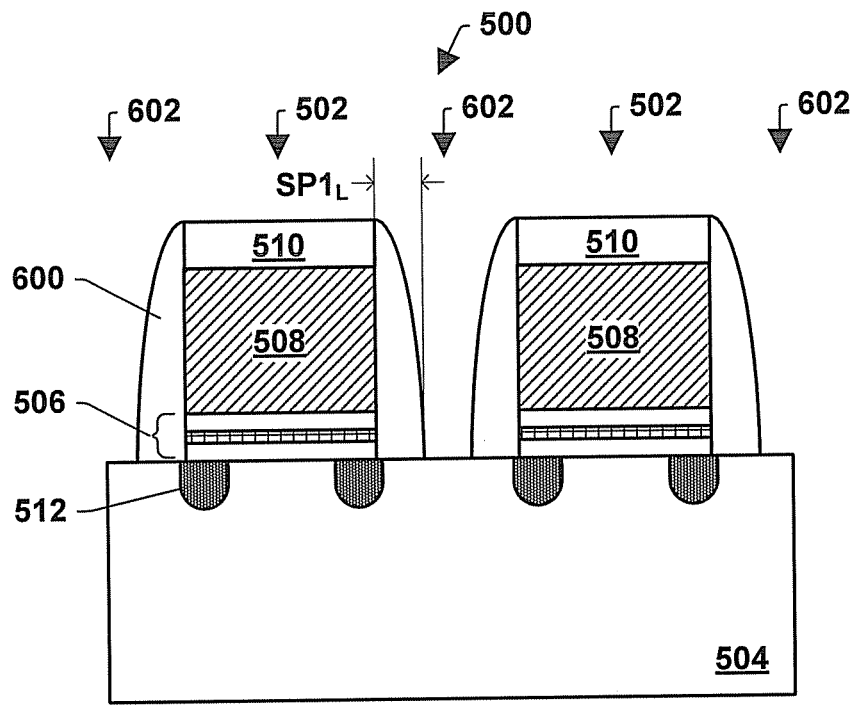

FIG. 6 illustrates forming first spacers 600 adjacent the side surface of the feature 502 (e.g., the first mask 510, the poly gate 508, and the charge trapping dielectric stack 506) and on the upper surface of the semiconductor substrate 504 in the bit line opening 514 and forming first openings 602 between the first spacers 600. The first spacer 600 can serve as an implant screen when forming first bit lines in subsequent processes. After forming the two first spacers 600, a portion of the upper surface of the semiconductor substrate 504 that is not covered by the first spacers 600 is exposed in the first opening 602.

The first spacer 600 can contain any suitable material so that the first spacer 600 can serve as an implant screen when forming bit lines in subsequent processes. The spacer material can be selected so that there is etch selectivity between the first spacer 600 and other components of the memory device 500 (e.g., the semiconductor substrate 504). The spacer material can have a lower etch rate than the semiconductor substrate 504 in a subsequent etching process. For example, an etching rate of an oxide material is markedly slower than an etching rate of a silicon material with respect to a silicon etchant. Accordingly, in one embodiment, the first spacer 600 contains an oxide material. Examples of oxides include silicon oxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, and the like. Other examples of spacer materials include nitrides (e.g., silicon nitride, silicon oxynitride, and silicon rich silicon nitride), silicates, diamond-like carbon, carbide, and the like.

The first spacer 600 can be formed by any suitable technique, for example, forming a layer containing the spacer material over the semiconductor substrate 504 and then removing portions of the spacer material layer not near the side surface of the feature 502. The spacer material layer can be formed at least over the side surface of the feature 502.

In one embodiment, the spacer material layer is formed by a HTO process. For example, the HTO is formed by low pressure chemical vapor deposition (LPCVD) using nitrous oxide ($N_2O$) and dichlorosilane ($SiH_2Cl_2$) gasses at a temperature of about 600 degrees Celsius or more and about 900 degrees Celsius or less and a pressure of about 100 mTorr or more and about 500 mTorr or less. In another embodiment, the spacer material layer is grown in plasma at low temperatures, e.g., plasma-grown oxide. For example, the spacer material layer contains plasma-grown oxide that is grown at a temperature of about 250 degrees Celsius or more and about 600 degrees Celsius or less. The spacer material layer can be formed by a HDP process. The spacer material layer can be optionally subjected to an anneal, for example, in a nitrogen ambient at about 1,000 degrees Celsius for thirty minutes.

After forming the spacer material layer, portions of the spacer material layer can be removed, for example, etching. Any suitable etching can be used as long as the etching can leave a first spacer 600 adjacent the side surface of the feature 502 and on the semiconductor substrate 504. Examples of etching include reactive ion etching, chemical plasma etching, or other suitable anisotropic etching utilizing a suitable chemistry.

Choice of a suitable process and reagents of etching depends on, for example, the spacer material, the width and length of the spacer material, the desired implementations of the memory device 500 being fabricated, and the like. In one embodiment, reactive ion etching is used with an appropriate etchant for the selected spacer material. For example, when the first spacer 600 contains silicon oxides or silicon nitrides, examples of etchants include $CF_4$ or $CHF_3$. In another embodiment, when the first spacer 600 contains diamond-like carbon, examples of etchants include oxygen-based plasma. In yet another embodiment, when the first spacer 600 contains silicon carbide, examples of etchants include $CF_4$, $CH_2F_2$, or $C_2F_6$.

The first spacer 600 can have any suitable lateral length ($SP1_L$) that depends on, for example, the desired length of the subsequently formed first bit line, the desired implementations of the memory device 500 being fabricated, and the like. Since the first spacer 600 can serve as an implant screen, the lateral length of the first spacer 600 can control and/or determine a lateral length of a first bit line that is formed in the semiconductor substrate 504 in a subsequent process as described below. In one embodiment, the first spacer 600 has a lateral length of about 1 nm or more and about 50 nm or less. In another embodiment, the first spacer 600 has a lateral length of about 5 nm or more and about 40 nm or less. In yet another embodiment, the first spacer 600 has a lateral length of about 10 nm or more and about 30 nm or less.

Figure 7:
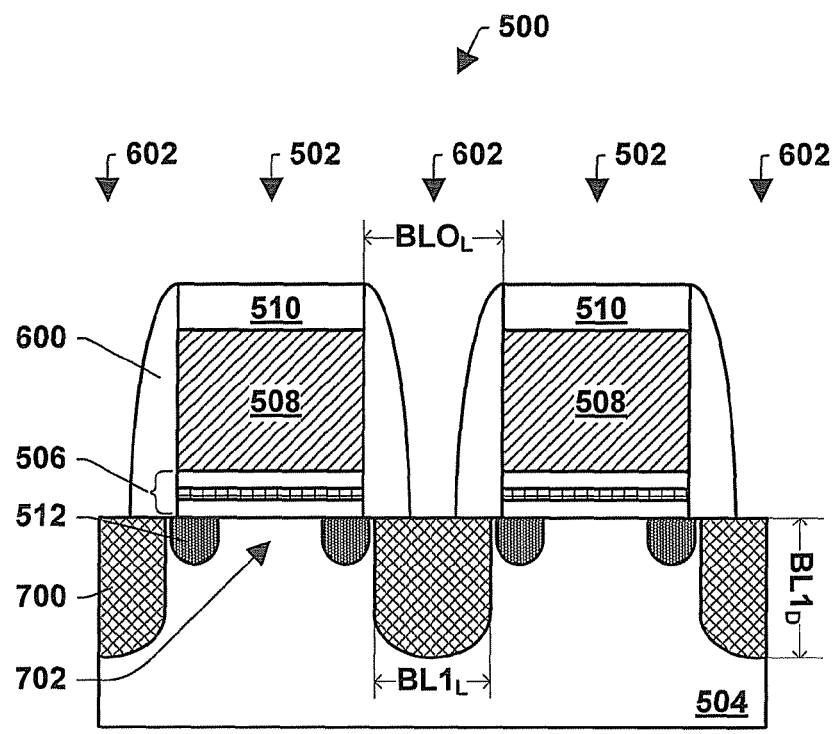

FIG. 7 illustrates forming first bit lines 700 in the semiconductor substrate 504 under the first openings 602 adjacent the charge trapping dielectric stack 506. Any suitable implant compositions and concentrations can be employed for the first bit lines 700. For example, the first bit lines 700 include one or more n-type dopants (e.g., arsenic, phosphorous, antimony).

The first bit lines 700 can be formed by any suitable technique. The first bit line 700 can be formed by implantation of one or more dopants. The dopants pass through the bit line opening 700 between the first spacers 600 and are implanted into the semiconductor substrate 504 under the bit line opening 700, leaving a channel region 702 of the semiconductor substrate 504 between the first bit lines 700. The first mask layer 510 and/or the first spacer 600 can serve as an implant screen. That is, the spacer is used to offset the implants and the spacer can constrain the implant in a narrower implant region. As a result, the memory cell can advantageously have a decreased bit line length and an increased effective channel length. In one embodiment, because of the decreased bit line length, the first bit line 700 does not overlap with the poly gate 508 in the lateral direction. In another embodiment, the first bit line 700 does not overlap with the pocket implant region 512.

In one embodiment, the lateral length of first bit line ($BL1_L$) is about 70% or more and about 100% or less of the length of the bit line opening ($BLO_L$). In another embodiment, the lateral length of first bit line is about 70% or more and about 97% or less of the length of the bit line opening. In yet another embodiment, the lateral length of first bit line is about 70% or more and about 95% or less of the length of the bit line opening. In still yet another embodiment, the lateral length of first bit line is about 70% or more and about 90% or less of the length of the bit line opening.

The first spacers 600 can allow the bit line implant with higher energy and/or higher dose without suffering device short channel roll off issues. This is because the spacer at the bit line sidewall can constrain the implant in a narrower implant region. The spacer can tolerate higher energy bit line implant (which usually have high implant strangle) without leading to too wide bit line and device short channel effect. Higher energy bit line implant can form deeper bit line junction and can effectively block the hot electron move to the adjacent cell and prevent TPD.

The first bit line 700 can be formed by single implant with a relatively higher energy level and/or a relatively higher dose of dopants. In one embodiment, the first bit line 700 is formed at an energy level of about 5 KeV or more and about 100 KeV or less and a dose of about 2E13 atoms/$cm^2$ or more and about 4E15 atoms/$cm^2$ or less. In another embodiment, the first bit line 700 is formed at an energy level of about 10 KeV or more and about 100 KeV or less and a dose of about 5E13 atoms/$cm^2$ or more and about 4E15 atoms/$cm^2$ or less. In yet another embodiment, the first bit line 700 is formed at an energy level of about 20 KeV or more and about 100 KeV or less and a dose of about 1E14 atoms/cm$^2$ or more and about 4E15 atoms/cm$^2$ or less.

In another embodiment, the first bit line 700 can be formed by two implants: a first implant with a relatively higher energy level and/or a relatively higher dose of dopants and a second implant with a relatively lower energy level and/or a relatively lower dose of dopants. The first implant can be performed in the same manner as described above. In one embodiment, the second implant with a relatively lower energy level and/or a relatively lower dose of dopants is performed at an energy level of about 1 KeV or more and about 40 KeV or less and a dose of about 1E13 atoms/cm$^2$ or more and about 4E15 atoms/cm$^2$ or less. In another embodiment, the second implant is performed at an energy level of about 2 KeV or more and about 40 KeV or less and a dose of about 2E13 atoms/cm$^2$ or more and about 4E15 atoms/cm$^2$ or less. In yet another embodiment, the second implant is performed at an energy level of about 5 KeV or more and about 40 KeV or less and a dose of about 5E13 atoms/cm$^2$ or more and about 4E15 atoms/cm$^2$ or less. The first high energy implant can prevent a TPD phenomenon and both the first and second implants can reduce the bit line resistance.

The resultant first bit line 700 can have a higher concentration of dopants because of the higher energy and/or higher dose implant. In one embodiment, the first bit line 700 has a concentration of dopants of about 5E17 atoms/cm$^3$ or more and about 1E21 atoms/cm$^3$ or less. In another embodiment, the first bit line 700 has a concentration of dopants of about 1E18 atoms/cm$^3$ or more and about 1E21 atoms/cm$^3$ or less. In yet another embodiment, the first bit line 700 has a concentration of dopants of about 5E18 atoms/cm$^3$ or more and about 1E21 atoms/cm$^3$ or less.

The first bit line 700 can have an increased depth because of the higher energy and/or higher dose implant. In one embodiment, the first bit line 700 has a depth (BL1$_D$) of about 30 nm or more and about 300 nm or less. In another embodiment, the first bit line 700 has a depth of about 40 nm or more and about 250 nm or less. In yet another embodiment, the first bit line 700 has a depth of about 50 nm or more and about 200 nm or less.

Figure 8:
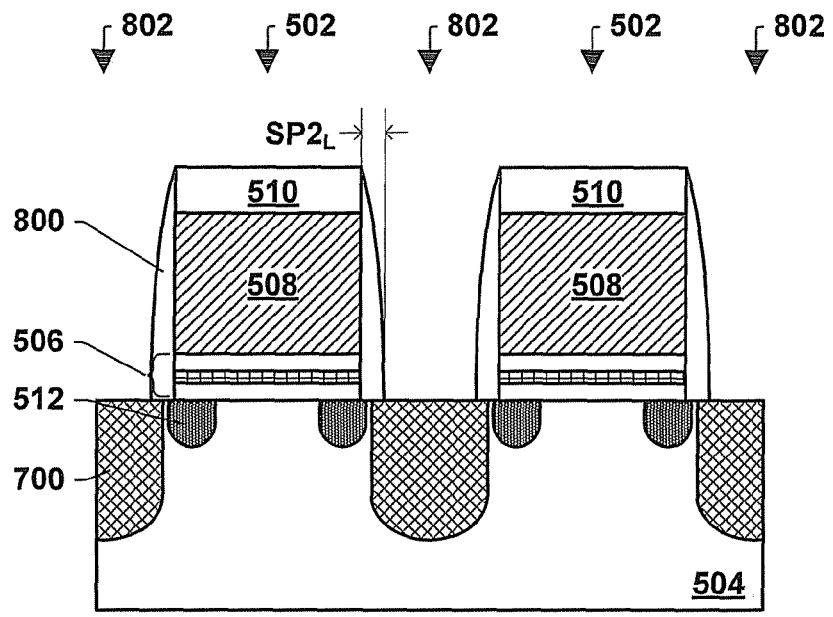

FIG. 8 illustrates decreasing a lateral length of the first spacers and increasing a lateral length of the first openings, thereby forming second spacers 800 and second openings 802. The second spacer 800 can serve as an implant screen when forming second bit lines in subsequent processes. After forming the two second spacers 800, a portion of the upper surface of the semiconductor substrate 504 that is not covered by the second spacers 600 is exposed in the second opening 802.

The lateral length of the first spacer can be decreased by any suitable technique, for example, etching (e.g., dip back or etch back). Any suitable etching can be used as long as the etching can decrease the lateral length of the first spacer. Dry etching or wet etching can be used. When the first spacer contains oxide materials, examples of oxide etchants include halogen acids such as hydrofluoric acid. In one embodiment, the oxide etchant is a hydrofluoric acid solution such as a dilute hydrofluoric acid (DHF) or a buffered hydrofluoric acid (BHF: e.g., hydrofluoric acid-ammonium fluoride buffered solution). In another embodiment, the oxide etchant is a vapor of hydrofluoric acid. In yet another embodiment, the lateral length of the first spacer is decreased by an oxide etchant gas, such as SiCl$_4$/Cl$_2$, BCl$_3$/Cl$_2$, CCl$_4$, mixtures of fluorinated or chlorinated gases, mixtures of Freon-based gases, or the like. Choice of a suitable process and reagents of etching depends on, for example, the spacer material, the width and length of the spacer, the desired implementations of the memory device 500 being fabricated, and the like.

The resultant second spacer 800 can have any suitable lateral length (SP2$_L$) that depends on, for example, the desired length of the subsequently formed second bit line, the desired implementations of the memory device 500 being fabricated, and the like. Since the second spacer 800 can serve as an implant screen, the lateral length of the second spacer 800 can control and/or determine a lateral length of a second bit line.

The lateral length (SP2$_L$) of the second spacer 800 is smaller than the lateral length of the first spacer 600. In one embodiment, the second spacer 800 has a lateral length of about 1 nm or more and about 30 nm or less. In another embodiment, the second spacer 800 has a lateral length of about 3 nm or more and about 25 nm or less. In yet another embodiment, the second spacer 800 has a lateral length of about 5 nm or more and about 20 nm or less.

Figure 9:
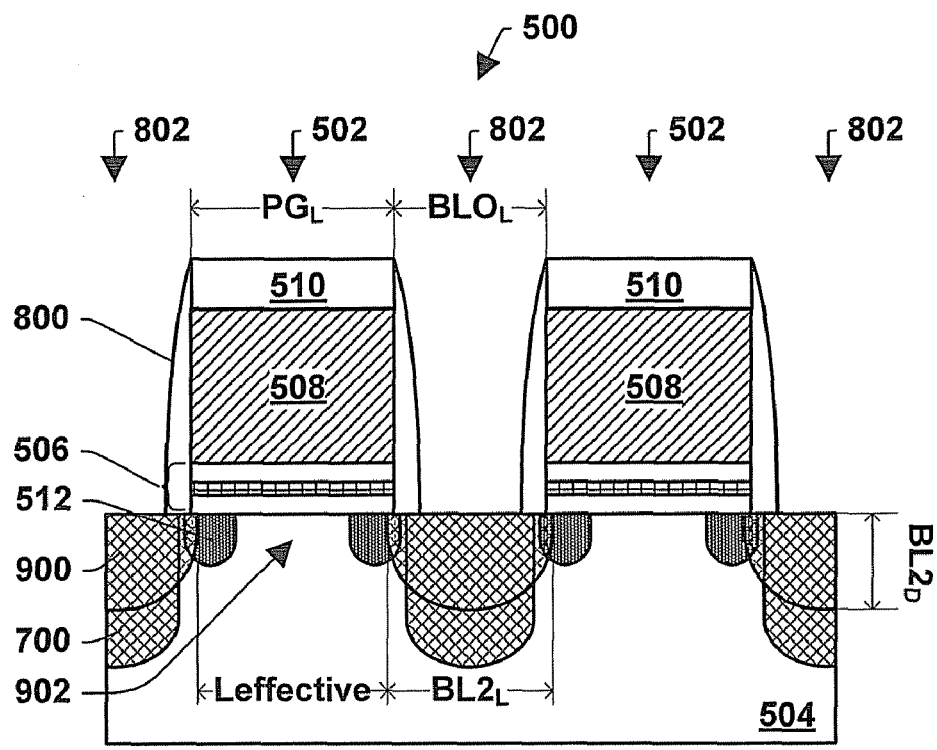

FIG. 9 illustrates forming second bit lines 900 in the semiconductor substrate 504 under the second openings 802 adjacent the charge trapping dielectric stack 506. Any suitable implant compositions and concentrations can be employed for the second bit lines 900. For example, the second bit lines 900 include one or more n-type dopants (e.g., arsenic, phosphorous, antimony).

The second bit lines 900 can be formed by any suitable technique. The second bit line 900 can be formed by implantation of one or more dopants. The dopants pass through the second openings 802 between the second spacers 800 and are implanted into the semiconductor substrate 504 under the second opening 802, leaving a channel region 902 of the semiconductor substrate 504 between the second bit lines 900. The first mask layer 510 and/or the second spacer 900 can serve as an implant screen. That is, the spacer is used to offset the implants and the second spacer can constrain the implant in a narrower implant region. As a result, the memory cell can advantageously have a decreased bit line length and an increased effective channel length.

In one embodiment, the lateral length of second bit line (BL2$_L$) is about 70% or more and about 140% or less of the length of the bit line opening (BLO$_L$). In another embodiment, the bit line length is about 70% or more and about 120% or less of the length of the bit line opening. In yet another embodiment, the bit line length is about 70% or more and about 110% or less of the length of the bit line opening. In still yet another embodiment, the bit line length is about 70% or more and about 100% or less of the length of the bit line opening.

The second bit line 900 can be formed at any suitable energy level and/or dose of dopants. In one embodiment, the second bit lines are formed at a lower energy level, a lower concentration of dopants, or combinations thereof compared to an energy level and a concentration of dopants of the first bit lines. For example, the second bit line 900 is formed at an energy level of about 1 KeV or more and about 40 KeV or less and a dose of about 1E13 atoms/cm$^2$ or more and about 4E15 atoms/cm$^2$ or less. In another embodiment, the second bit line 900 is formed at an energy level of about 2 KeV or more and about 40 KeV or less and a dose of about 2E13 atoms/cm$^2$ or more and about 4E15 atoms/cm$^2$ or less. In yet another embodiment, the second bit line 900 is formed at an energy level of about 5 KeV or more and about 40 KeV or less and a dose of about 5E13 atoms/cm$^2$ or more and about 4E15 atoms/cm$^2$ or less.

The second bit line 900 can have a lower concentration of dopants compared to a concentration of dopants of the first bit line. In one embodiment, the second bit line 900 has a concentration of dopants of about 1E16 atoms/cm$^3$ or more and about 1E19 atoms/cm³ or less. In another embodiment, the second bit line 900 has a concentration of dopants of about 5E16 atoms/cm³ or more and about 1E19 atoms/cm³ or less. In yet another embodiment, the second bit line 900 has a concentration of dopants of about 1E17 atoms/cm³ or more and about 1E19 atoms/cm³ or less.

The second bit line 900 can have a smaller depth compared to a depth of the first bit line. In one embodiment, the second bit line 900 has a depth ($BL2_D$) of about 5 nm or more and about 150 nm or less. In another embodiment, the second bit line 900 has a depth of about 10 nm or more and about 130 nm or less. In yet another embodiment, the second bit line 900 has a depth of about 20 nm or more and about 100 nm or less.

A portion of dopants of the second bit line 900 can diffuse under the poly gate 508, thereby forming gate overlap (e.g., drain/source gate overlap). In one embodiment, the lateral length of gate overlap is about 0% or more and about 30% or less of the lateral length of the poly gate (PGL). In another embodiment, the lateral length of gate overlap is about 0% or more and about 20% or less of the lateral length of the poly gate ($PG_L$). In yet another embodiment, the lateral length of gate overlap is about 0% or more and about 10% or less of the lateral length of the poly gate ($PG_L$). In still yet embodiment, the lateral length of gate overlap is about 0% or more and about 5% or less of the lateral length of the poly gate ($PG_L$).

A portion of the second bit line 900 can overlap with a portion of the pocket implant region 512. For example, an upper portion of the second bit line adjacent to the charge trapping dielectric stack 506 overlaps with a portion of the pocket implant region. In one embodiment, at least about 20% of the area of the pocket implant region overlap with the second bit line. In another embodiment, at least about 30% of the area of the pocket implant region overlap with the second bit line. In yet another embodiment, at least about 40% of the area of the pocket implant region overlap with the second bit line.

The second bit lines 900 can act as respective sources and drains for corresponding memory cells. As such, respective effective channel lengths (Leffective) are defined between corresponding pairs of the second bit lines 900. In one embodiment, the effective channel length is about 70% or more and about 100% or less of the lateral length of the poly gate ($PG_L$). In another embodiment, the effective channel length is about 80% or more and about 100% or less of the lateral length of the poly gate ($PG_L$). In yet another embodiment, the effective channel length is about 90% or more and about 100% or less of the lateral length of the poly gate ($PG_L$). In still yet another embodiment, the effective channel length is about 95% or more and about 100% or less of the lateral length of the poly gate ($PG_L$).

Figure 10:
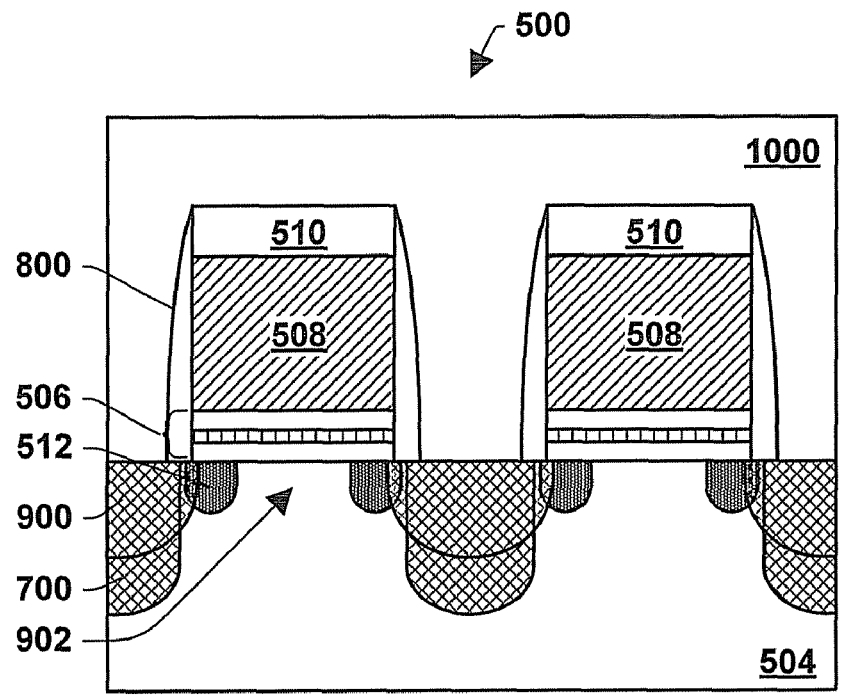

FIG. 10 illustrates forming a bit line dielectric layer 1000 over the semiconductor substrate 504. The bit line dielectric layer 1000 can contain any suitable dielectric material such as oxides. Examples of oxides include silicon oxide, TEOS oxide, HARP oxide, HTO, HDP oxide, ALD oxide, and the like. In one embodiment, the bit line dielectric layer contains the same material as the first spacer 600.

The second spacer 800 may or may not be removed before forming a bit line dielectric layer 1000. In one embodiment, the spacer is not removed before forming the bit line dielectric layer. When the spacer is not removed, the bit line opening 514 contains at least a portion of the spacer. In another embodiment, the spacer is removed before forming a bit line dielectric layer (not shown). When the spacer is removed, the bit line opening does not contain spacers. The spacer can be removed by any suitable technique, for example, etching.

Figure 11:
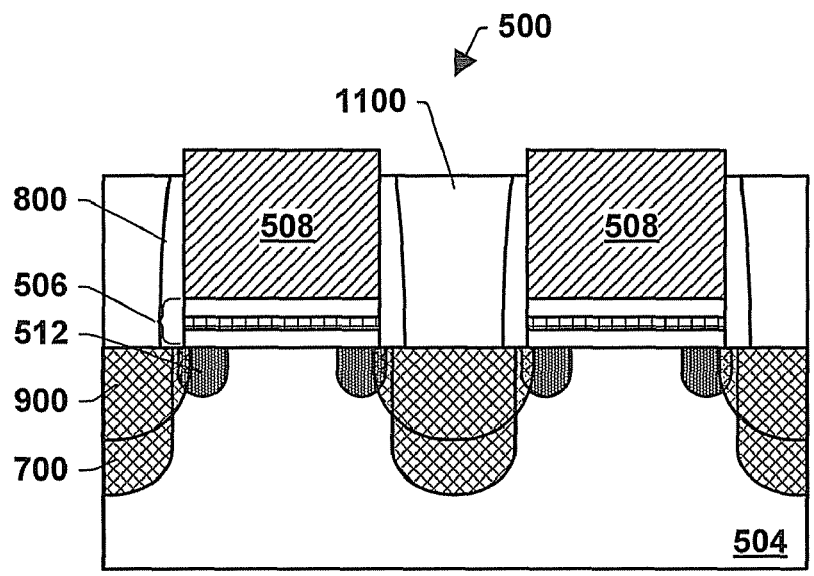

FIG. 11 illustrates removing the first mask layer 510 and removing an upper portion of the bit line dielectric layer 1000, thereby forming a bit line dielectric 1100 in the bit line opening 514. When the spacer exists in the bit line opening, an upper portion of the spacer may or may not be removed. When the bit line dielectric layer 1000 contains the same material as the spacer, the upper potions of the bit line dielectric layer 1000 and the spacer can be removed at the same time.

The first mask layer 510 can be removed by any suitable technique. For example, when the first mask layer 510 contains nitride materials, the first mask layer 510 can be removed by contacting the first mask layer 510 with any suitable nitride etchant that does not substantially affect or damage the integrity of other layers in the memory device 500 such as the poly layer 508. Examples of nitride etchants include phosphoric acid. Other nitride etchants can also be used as long as they are capable of removing the first mask layer 510 selective to other layers.

The upper portion of the bit line dielectric layer 1000 can be removed by any suitable technique. For example, the upper portion of the bit line dielectric layer is removed by chemical-mechanical polishing (CMP) and/or etching. For example, the upper portion of the bit line dielectric layer is polished by CMP under any suitable condition to facilitate removing/polishing the upper portion. The conditions generally depend upon, for example, the thickness of the bit line dielectric layer, the composition of the bit line dielectric layer, the desired implementations of the memory device 500 being fabricated, and the like.

The upper portion of the bit line dielectric layer 1000 can be further removed by etching. For example, when the bit line dielectric layer 1000 contains oxide materials, the upper portion can be removed by contacting the bit line dielectric layer 1000 with any suitable oxide etchant that does not substantially affect or damage the integrity of other layers in the memory device 500 such as the poly layer 508. Examples of oxide etchants include halogen acids such as hydrofluoric acid. In one embodiment, the oxide etchant is a hydrofluoric acid solution such as a buffered hydrofluoric acid (BHF: e.g., hydrofluoric acid-ammonium fluoride buffered solution). In another embodiment, the oxide etchant is a vapor of hydrofluoric acid. Other oxide etchants can also be used as long as they are capable of removing portions of the bit line dielectric layer 1000 selective to other layers.

Any suitable amount of the upper portion of the bit line dielectric layer 1000 can be removed. In one embodiment, the upper surface of the poly layer 508 is higher than the resultant upper surface of the bit line dielectric 1100. In another embodiment, the upper surface of the poly layer 508 is substantially coplanar with the upper surface of the bit line dielectric 1100 (not shown). In yet another embodiment, the upper surface of the poly layer 508 is lower than the upper surface of the bit line dielectric 1100 (not shown). Because of the removal of the upper portion of the bit line dielectric layer, the upper surface of the poly layer 508 can be exposed.

Figure 12:
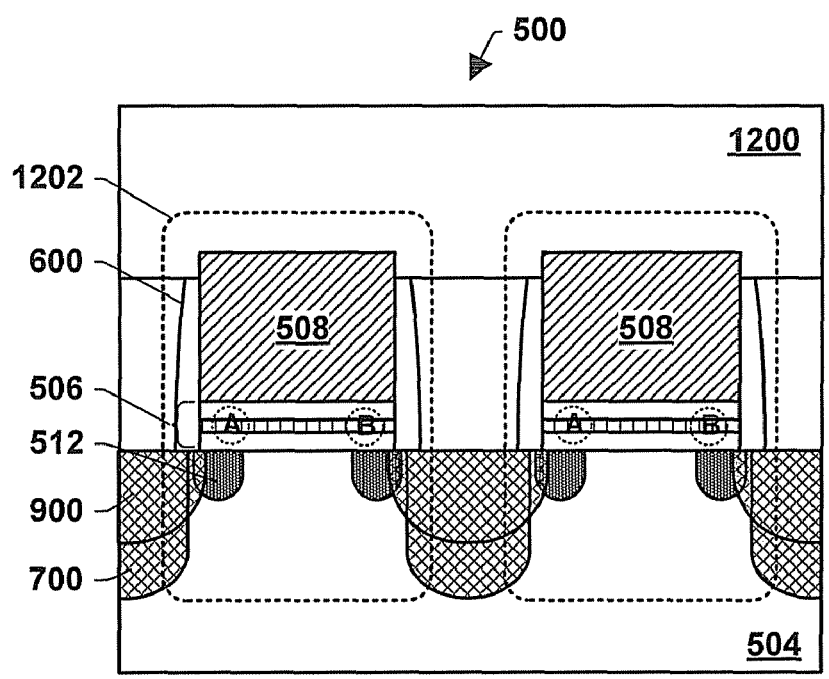

FIG. 12 illustrates forming a word line 1200 over the semiconductor substrate 504, thereby forming memory cells 1202 on the semiconductor substrate 504. The word line 1200 can contain any suitable conductive material such as polysilicon. The word line 1200 can be formed by, for example, forming a layer of word line material over the semiconductor substrate 504 and patterning (e.g., etching) the layer to establish the word line 1200 over the bit lines 700, 900. The bit lines 700, 900 and the word line 1200 can be oriented at substantially right angles relative to one another. When the spacers are not removed and present in the bit line opening 514, the memory cells are offset by the spacers and the bit line dielectrics 1100.

The memory cell 1202 contains the charge trapping dielectric stack 506 on the semiconductor substrate 504 and the poly gate 508 on the charge trapping dielectric stack 506. The memory cell 1202 contains a pair of the first bit lines 700 and a pair of the second bit lines 900 in the semiconductor substrate 504 adjacent the charge trapping dielectric stack 506 and under the bit line openings 514. The memory cells 1002 are separated by the bit line dielectrics 1100 in the bit line openings 514.

The memory cell 1202 contains one or more charge storage nodes. The charge storage nodes can store at least a bit of information, respectively. For example, the memory cell 1202 is capable of storing two spatially separated binary data bits, including a left bit represented by the dashed circle A and a right bit represented by the dashed circle B. When the memory cell 1202 is such a dual-bit memory cell, the dual-bit memory cell is generally symmetrical, wherein a drain and a source are interchangeable, although asymmetric implementations are possible within the scope of the innovation. In the exemplary memory cell 1202, the left first and second bit line 700, 900 may serve as the source terminal and the right first and second bit line 700, 900 as the drain terminal with respect to the right bit. Likewise, the right first and second bit line 700, 900 may serve as the source terminal and the left first and second bit line 700, 900 as the drain terminal for the left bit.

The subject innovation may be implemented in association with various single or multi-bit memory cell types including a SONOS cell. In addition, the innovation is applicable to such dual-bit memory devices wherein both bits are used for data or information storage, as well as those in which only one bit (e.g., bit A or bit B) of the dual-bit cell is so used. Although not shown in Figures, the charge trapping dielectric stack contains a dielectric portion between the charge storage nodes, and the charge storage nodes are physically separated from each other.

Figure 13:
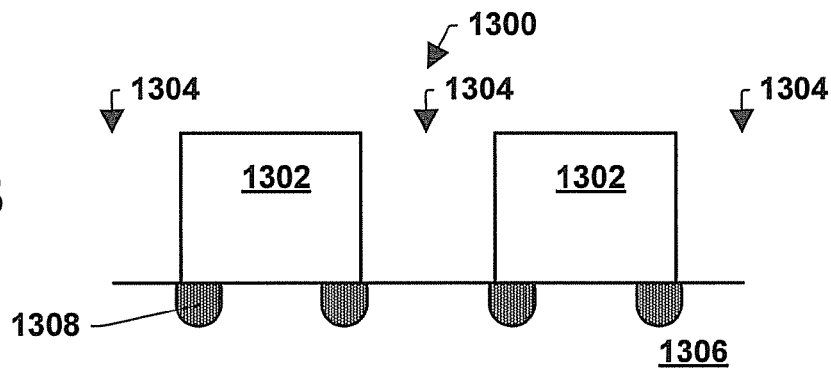
FIGS. 13-19 illustrate another exemplary method for making a memory device in accordance with an aspect of the subject innovation.

FIG. 13 illustrates a cross sectional view of an intermediate state of a portion of another exemplary memory device 1300. The memory device 1300 can contain one or more features 1302 and bit line openings 1304 therebetween on a semiconductor substrate 1306. The semiconductor substrate contains two pocket implant regions 1308 adjacent and under the features 1302 in the same manner as described in connection with FIG. 5. The features 1302 can contain a charge trapping dielectric stack, a poly layer, and the like in the same manner as described in connection with FIG. 5.

Figure 14:
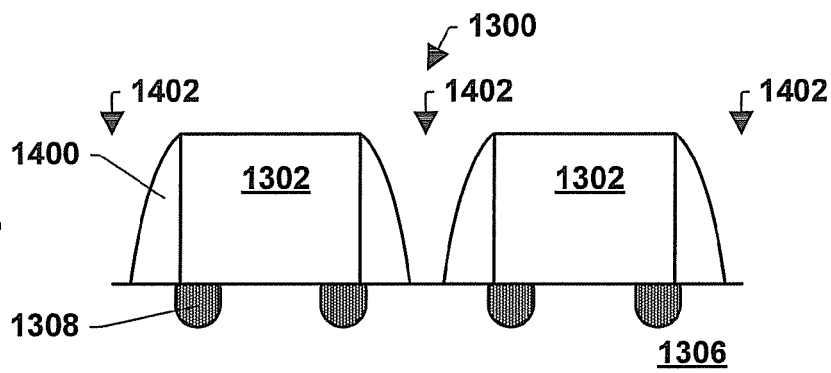

FIG. 14 illustrates forming first spacers 1400 adjacent the side surface of the feature 1302 and on the upper surface of the semiconductor substrate 1306 in the bit line opening 1304 and forming first openings 1402 between the first spacers 1400 in the same manner as described in connection with FIG. 6. After forming the first spacers 1400, a portion of the upper surface of the semiconductor substrate 1306 that is not covered by the first spacers 1400 is exposed in the first opening 1402.

Figure 15:
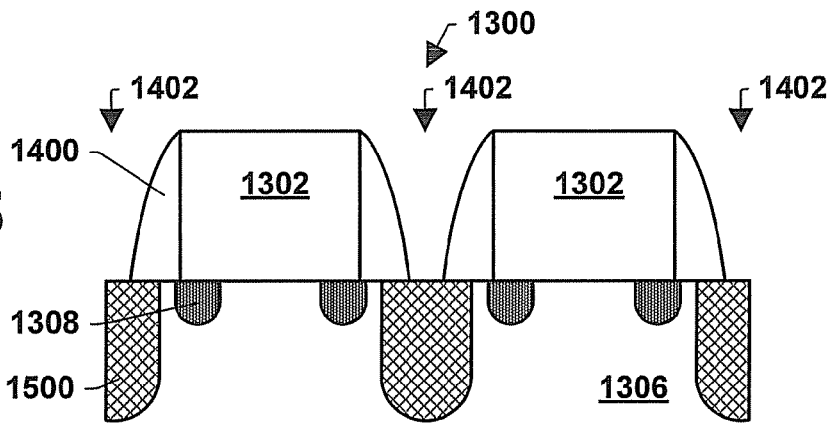

FIG. 15 illustrates forming first bit lines 1500 in the semiconductor substrate 1306 under the first openings 1402 adjacent the features 1302. The first bit line 1500 can be formed by implantation of one or more dopants in the same manner as described in connection with FIG. 7. The first spacer 1400 can serve as an implant screen. That is, the first spacer 1600 is used to offset the implants and the first spacer can constrain the implant in a narrower implant region. As a result, the resultant memory cell can advantageously have a decreased bit line length and an increased effective channel length. In one embodiment, because of the decreased bit line length, the first bit line 1500 does not overlap with the feature 1302 in the lateral direction. In another embodiment, the first bit line 1500 does not overlap with the pocket implant region 1308.

Figure 16:
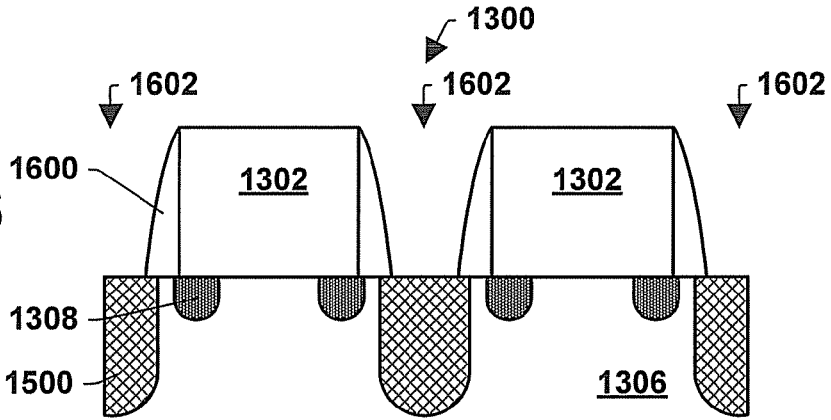

FIG. 16 illustrates decreasing a lateral length of the first spacers and increasing a lateral length of the first openings, thereby forming second spacers 1600 and second openings 1602. The lateral length of the first spacer can be decreased by any suitable technique, for example, etching (e.g., dip back or etch back) in the same manner as described in connection with FIG. 8. The lateral length of second spacer is smaller than the lateral length of first spacer.

Figure 17:
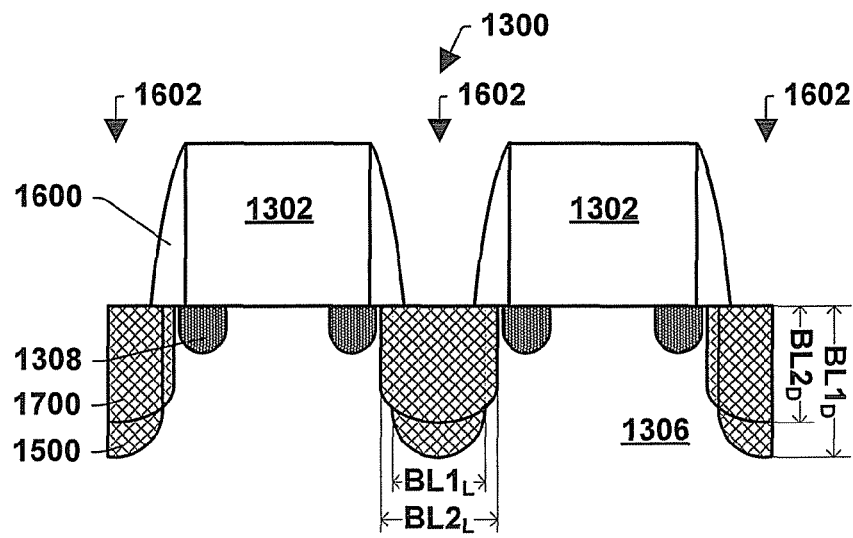

FIG. 17 illustrates forming second bit lines 1700 in the semiconductor substrate 1306 under the second openings 1602 adjacent the features 1302. The second bit lines 1700 can be formed by implantation of one or more dopants. The second spacer 1600 can serve as an implant screen, thereby offsetting the implants and constraining the implants in a narrower implant region.

The lateral length of second bit line ($BL2_L$) is greater than the lateral length of first bit line ($BL1_L$) because the lateral length of the second opening is greater than the lateral length of the first opening. In one embodiment, the depth ($BL2_D$) of the second bit line 1700 is smaller than the depth ($BL1_D$) of the first bit line. In another embodiment, the second bit line 1700 can be formed at a lower energy level, a lower concentration of dopants, or combinations thereof compared to an energy level and a concentration of dopants of the first bit lines. In yet another embodiment, the second bit line 1700 can have a lower concentration of dopants compared to a concentration of dopants of the first bit line. A portion of the second bit line 1700 may or may not overlap with a portion of the feature 1302 in the lateral direction. In another embodiment, a portion of the second bit line 1700 may or may not overlap with a portion of the pocket implant region 1308.

Figure 18:
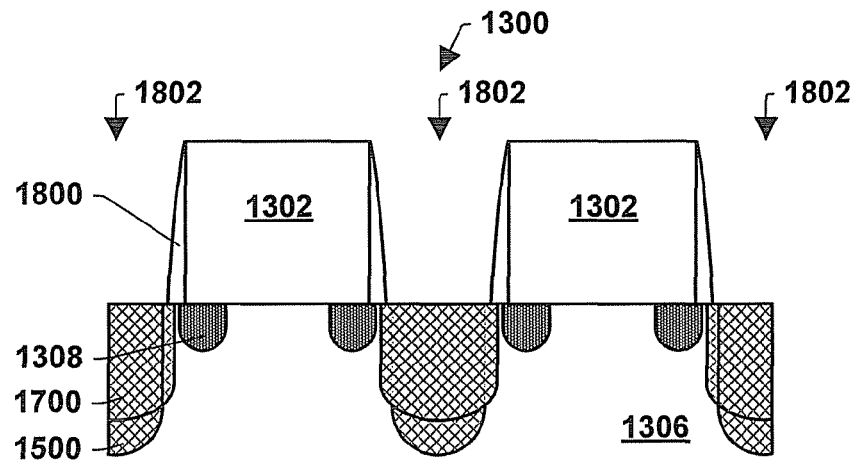

FIG. 18 illustrates decreasing a lateral length of the second spacers and increasing a lateral length of the second openings, thereby forming third spacers 1800 and third openings 1802. The lateral length of the second spacer can be decreased by any suitable technique, for example, etching (e.g., dip back or etch back).

Figure 19:
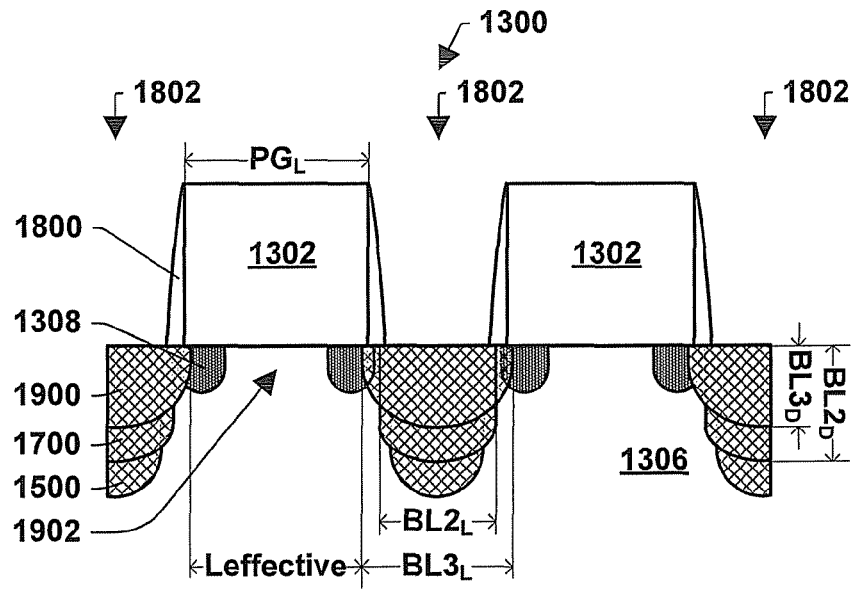

FIG. 19 illustrates forming third bit lines 1900 in the semiconductor substrate 1306 under the third openings 1802 adjacent the features 1302. The third bit lines 1900 can be formed by implantation of one or more dopants. The third spacer 1800 can serve as an implant screen, thereby offsetting the implants and constraining the implants in a narrower implant region. The dopants pass through the third opening 1802 between the third spacers 1400 and are implanted into the semiconductor substrate 1306 under the third opening 1802, leaving a channel region 1902 of the semiconductor substrate 1306 between the third bit lines 1900. As a result, the memory cell can advantageously have a decreased bit line length and an increased effective channel length (Leffective).

The lateral length of third bit line ($BL3_L$) is greater than the lateral length of second bit line ($BL2_L$) because the lateral length of the third opening is greater than the lateral length of the second opening. In one embodiment, the depth ($BL3_D$) of the third bit line 1900 is smaller than the depth ($BL2_D$) of the second bit line. In another embodiment, the third bit line 1900 is formed at a lower energy level, a lower concentration of dopants, or combinations thereof compared to an energy level and a concentration of dopants of the second bit lines. In yet another embodiment, the third bit line 1900 has a lower concentration of dopants compared to a concentration of dopants of the second bit line.

A portion of dopants of the third bit line 1900 can diffuse under the poly gate of the feature 1302, thereby forming gate overlap (e.g., drain/source gate overlap). In one embodiment, the lateral length of gate overlap is about 0% or more and about 30% or less of the lateral length of the poly gate ($PG_L$). In another embodiment, the lateral length of gate overlap is about 0% or more and about 20% or less of the lateral length of the poly gate ($PG_L$). In yet another embodiment, the lateral length of gate overlap is about 0% or more and about 10% or less of the lateral length of the poly gate ($PG_L$). In still yet embodiment, the lateral length of gate overlap is about 0% or more and about 5% or less of the lateral length of the poly gate ($PG_L$).

A portion of the third bit line 1900 can overlap with a portion of the pocket implant region 1308. For example, an upper portion of the third bit line adjacent to the feature overlaps with a portion of the pocket implant region. In one embodiment, at least about 20% of the area of the pocket implant region overlap with the third bit line. In another embodiment, at least about 30% of the area of the pocket implant region overlap with the third bit line. In yet another embodiment, at least about 40% of the area of the pocket implant region overlap with the third bit line.

The first, second, and third bit lines 1900 can act as respective sources and drains for corresponding memory cells. As such, respective effective channel lengths are defined between corresponding pairs of the first, second, and third bit lines. In one embodiment, the effective channel length (Leffective) is about 70% or more and about 100% or less of the lateral length of the poly gate ($PG_L$). In another embodiment, the effective channel length is about 80% or more and about 100% or less of the lateral length of the poly gate. In yet another embodiment, the effective channel length is about 90% or more and about 100% or less of the lateral length of the poly gate. In still yet another embodiment, the effective channel length is about 95% or more and about 100% or less of the lateral length of the poly gate.

Although not shown in Figures, the method of forming memory devices can further involve decreasing the lateral length of the third spacers to form fourth spacers and forming fourth openings, and then forming fourth bit lines in the semiconductor substrate 1306 under the fourth openings adjacent the features 1302. The fourth bit lines can be formed by implantation of one or more dopants using the fourth spacers as an implant screen, thereby offsetting the implants and constraining the implants in a narrower implant region. As a result, the memory cell can advantageously have a decreased bit line length and an increased effective channel length.

When forming the fourth bit lines, the lateral length of fourth bit line ($BL4_L$) is greater than the lateral length of third bit line ($BL3_L$) because the lateral length of the fourth opening is greater than the lateral length of the third opening. In one embodiment, the depth of the fourth bit line is smaller than the depth of the third bit line. In another embodiment, the fourth bit line is formed at a lower energy level, a lower concentration of dopants, or combinations thereof compared to an energy level and a concentration of dopants of the third bit lines. In yet another embodiment, the fourth bit line has a lower concentration of dopants compared to a concentration of dopants of the third bit line.

Although not shown in Figures, bit line dielectrics can be formed in the bit line openings 1304 in the same manner as described in connection with FIGS. 10 and 11. The spacers (e.g., third spacers and fourth spacers) may or may not be removed before forming the bit line dielectrics. In one embodiment, word lines can be formed over the semiconductor substrate in the same manner as described in connection with FIG. 12.

Figure 20:
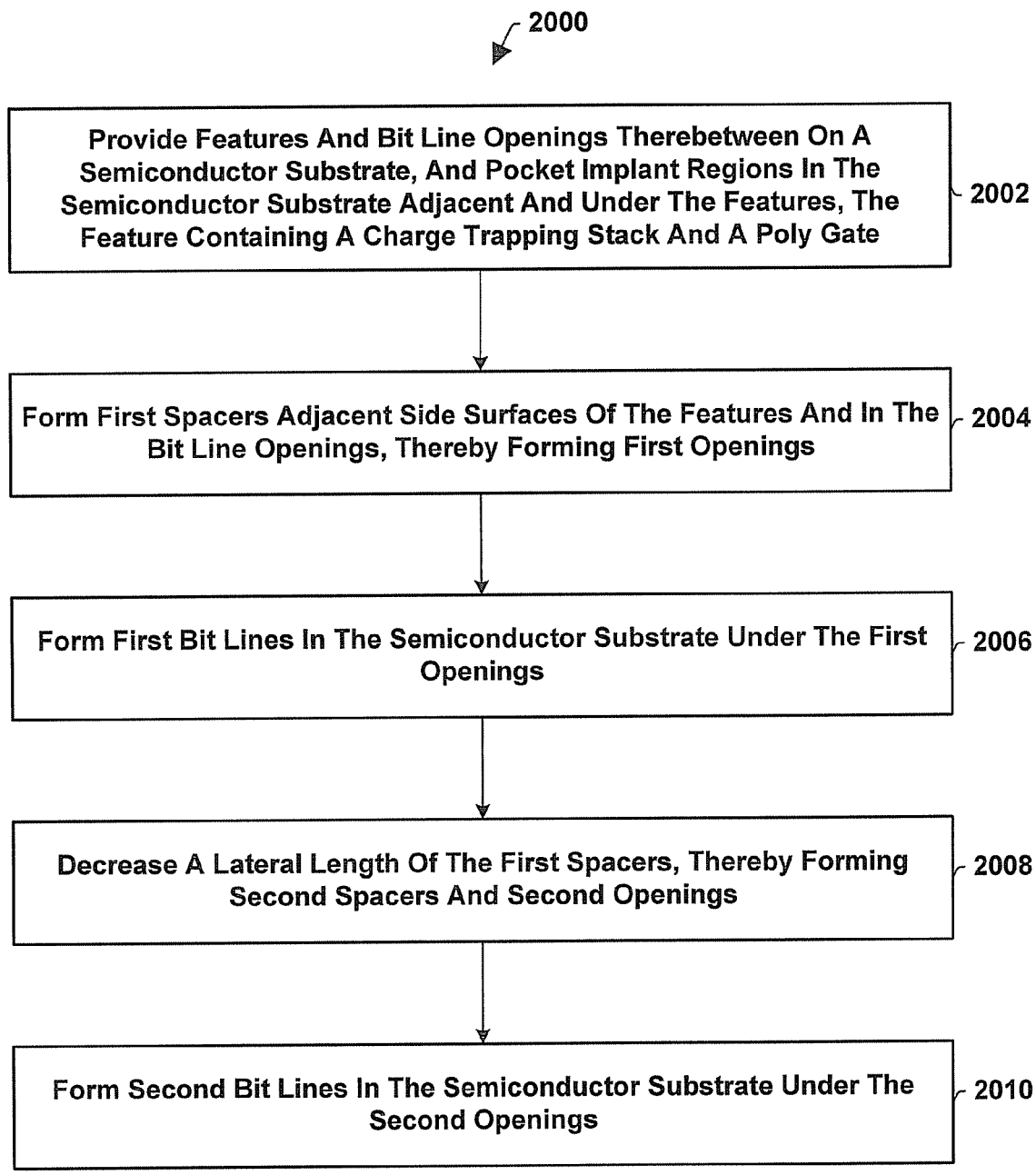
FIG. 20 is a flow diagram of an exemplary methodology of forming a memory device in accordance with an aspect of the subject innovation.

FIG. 20 illustrates an exemplary methodology 2000 of forming memory cells. At 2002, features are provided on a semiconductor substrate and bit line openings are provided between the features on the semiconductor substrate. The feature contains a charge trapping dielectric stack and a poly gate. Pocket implant regions are also provided in the semiconductor substrate adjacent and under the feature. At 2004, first spacers are formed adjacent side surfaces of the features and in the bit line openings, thereby forming first openings. The spacer can contain oxides or nitrides. At 2006, first bit lines are formed in the semiconductor substrate under the first openings. At 2008, a lateral length of the first spacers is decreased, thereby forming second spacers and second openings. At 2010, second bit lines are formed in the semiconductor substrate under the second opening.

Although not shown in FIG. 20, the methodology can involve one or more of the following features. The first bit lines are formed by implantation of one or more dopants using the first spacers as an implant screen and the second bit lines are formed by implantation of one or more dopants using the second spacers as an implant screen. The first and second spacers are formed by a high temperature oxide formation process. The second bit line is formed so that a lateral length of gate overlap is about 0% or more and about 30% or less of the lateral length of the poly gate.

The methodology can further involve forming bit line dielectrics in the bit line openings. The methodology can further involve forming bit line dielectrics in the bit line openings with the proviso that the second spacers are not removed from the second openings. The methodology can further involve decreasing a lateral length of the second spacers, thereby forming third spacers and third openings, and forming third bit lines in the semiconductor substrate under the third openings.

Figure 21:
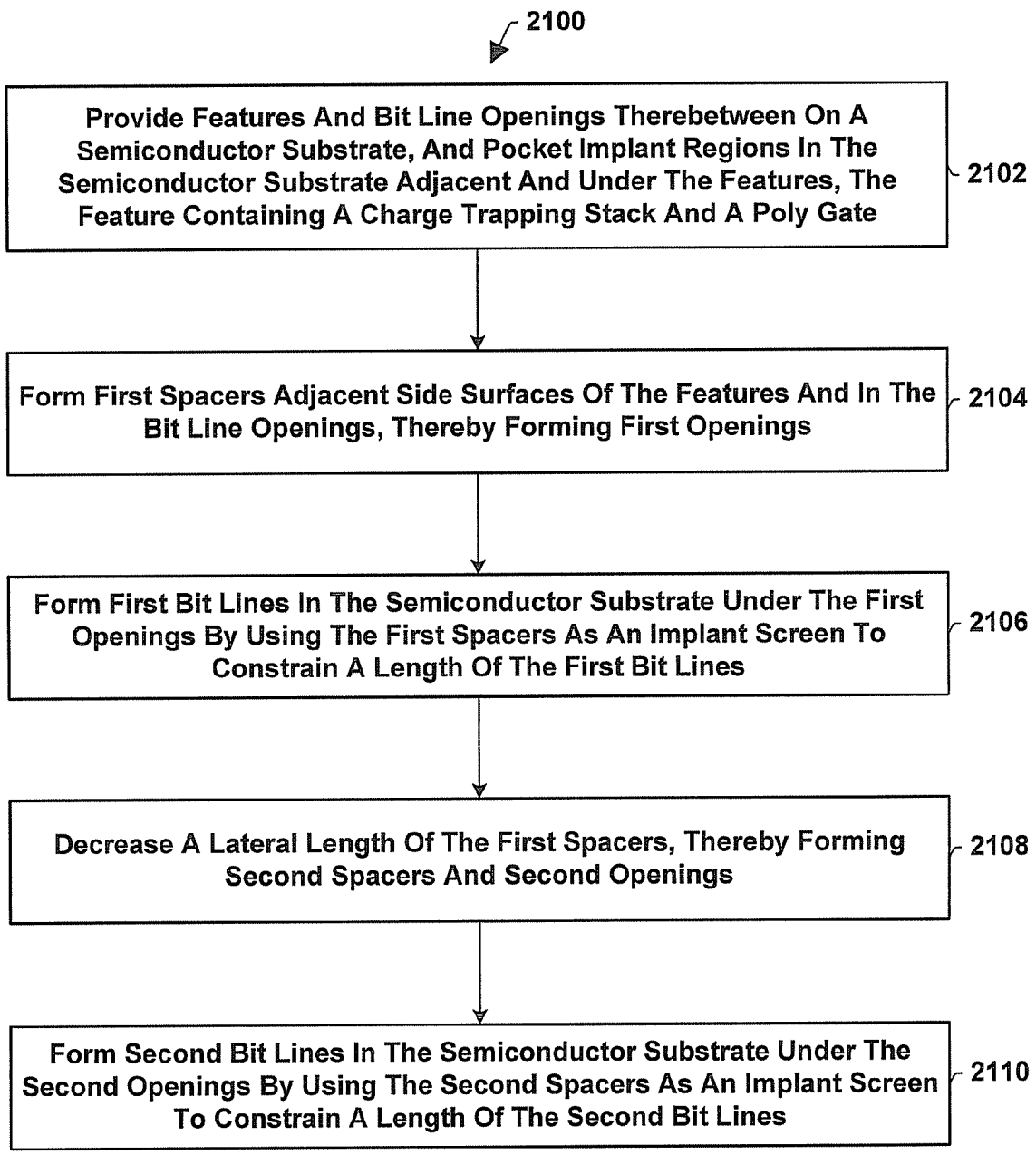
FIG. 21 is a flow diagram of an exemplary methodology of increasing an effective channel length in memory cells in accordance with an aspect of the subject innovation.

FIG. 21 illustrates an exemplary methodology 2100 of increasing an effective channel length in memory cells. At 2102, features are provided on a semiconductor substrate and bit line openings are provided between the features on the semiconductor substrate. The feature contains a charge trapping dielectric stack and a poly gate. At 2102, pocket implant regions are also formed in the semiconductor substrate adjacent and under the features. At 2104, first spacers are formed adjacent side surfaces of the features and in the bit line openings, thereby forming first openings. The spacer can contain oxides or nitrides. At 2106, first bit lines are formed in the semiconductor substrate under the first openings by using the first spacers as an implant screen to constrain a lateral length of the first bit lines. At 2108, a lateral length of the first spacers is decreased, thereby forming second spacers and second openings. At 2110, second bit lines are formed in the semiconductor substrate under the second opening by using the second spacers as an implant screen to constrain a lateral length of the second bit lines.

Although not shown in FIG. 21, the methodology can involve one or more of the following features. The first and second spacers are formed by a high temperature oxide formation process. The length of the second bit line is constrained so that an effective channel length of the memory cell is about 70% or more and about 100% or less of the lateral length of the poly gate. The first bit line is formed so that the first bit line does not overlap with the poly gate in the lateral direction, but the second bit line is formed so that a portion of the second bit line overlaps with a portion of the poly gate in the lateral direction.

In one embodiment, the methodology further involves forming bit line dielectrics in the bit line openings with the proviso that the second spacers are not removed from the second openings. In another embodiment, the methodology further involves decreasing a lateral length of the second spacers, thereby forming third spacers and third openings, and forming third bit lines in the semiconductor substrate under the third opening by using the third spacers as an implant screen to constrain a lateral length of the third bit lines.

Further, although not shown, the methodologies of FIGS. 20 and 21 may include any suitable memory device fabrication processes. General examples of memory device fabrication processes include masking, patterning, etching, planarization, cleaning, thermal oxidation, implant, annealing, thermal treatment, and deposition techniques normally used for making memory devices.

The resultant memory cell formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant memory cell formed herein is useful in any electronic device. For example, the resultant memory cell is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject innovation. It is, of course, not possible to describe every conceivable combination of components or methodologies for purposes of describing the subject innovation, but one of ordinary skill in the art may recognize that many further combinations and permutations of the subject innovation are possible. Accordingly, the subject innovation is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A method of making memory cells, comprising:
providing features and bit line openings therebetween on a semiconductor substrate, and pocket implant regions in the semiconductor substrate adjacent and under the features, the feature comprising a charge trapping dielectric stack and a poly gate;
forming first spacers adjacent side surfaces of the features and in the bit line openings, thereby forming first openings, the spacers comprising oxides or nitrides;
forming first bit lines in the semiconductor substrate under the first openings;
decreasing a lateral length of the first spacers, thereby forming second spacers and second openings;
forming second bit lines in the semiconductor substrate under the second openings;
decreasing a lateral length of the second spacers, thereby forming third spacers and third openings; and
forming third bit lines in the semiconductor substrate under the third openings.

2. The method of claim 1, wherein forming the first bit lines comprises implantation of one or more dopants using the first spacers as an implant screen and forming the second bit lines comprises implantation of one or more dopants using the second spacers as an implant screen.

3. The method of claim 1, wherein forming the first and second spacers comprises a high temperature oxide formation process.

4. The method of claim 1, wherein the second bit line is formed so that a length of gate overlap is about 0% or more and about 30% or less of the lateral length of the poly gate.

5. The method of claim 1 further comprising forming bit line dielectrics in the bit line openings.

6. The method of claim 1 further comprising forming bit line dielectrics in the bit line openings with the proviso that the second spacers are not removed from the second openings.

7. The method of claim 1, wherein forming the third bit lines comprises implantation of one or more dopants using the third spacers as an implant screen.

8. A method of increasing an effective channel length in memory cells, comprising:
providing features and bit line openings therebetween on a semiconductor substrate, and pocket implant regions in the semiconductor substrate adjacent and under the features, the feature comprising a charge trapping dielectric stack and a poly gate;
forming first spacers adjacent side surfaces of the features and in the bit line openings, thereby forming first openings, the spacers comprising oxides or nitrides;
forming first bit lines in the semiconductor substrate under the first openings by using the first spacers as an implant screen to constrain a lateral length of the first bit lines;
decreasing a lateral length of the first spacers, thereby forming second spacers and second openings;
forming second bit lines in the semiconductor substrate under the second opening by using the second spacers as an implant screen to constrain a lateral length of the second bit lines;
decreasing a lateral length of the second spacers, thereby forming third spacers and third openings; and
forming third bit lines in the semiconductor substrate under the third opening by using the third spacers as an implant screen to constrain a lateral length of the third bit lines.

9. The method of claim 8, wherein the first and second spacers are formed by a high temperature oxide formation process.

10. The method of claim 8, wherein the lateral length of the first bit line is constrained so that an effective channel length of the memory cell is about 70% or more and about 100% or less of the lateral length of the poly gate.

11. The method of claim 8, wherein the first bit line is formed so that the first bit line does not overlap with the poly gate in the lateral direction, but the second bit line is formed so that a portion of the second bit line overlaps with a portion of the poly gate in the lateral direction.

12. The method of claim 8 further comprising forming bit line dielectrics in the bit line openings with the proviso that the second spacers are not removed from the second openings.

13. The method of claim 8, wherein the third bit lines have a dopant concentration lower than a dopant concentration of the second bit lines.

14. A memory device comprising:
two or more memory cells and bit line openings therebetween on a semiconductor substrate, each memory cell comprising a charge trapping dielectric stack and a poly gate on the semiconductor substrate and two pocket implant regions in the semiconductor substrate adjacent and under the charge trapping dielectric stack;

bit line dielectrics in the bit line openings;

first bit lines in the semiconductor substrate under the bit line openings;

second bit lines in the semiconductor substrate under the bit line openings; and third bit lines in the semiconductor substrate under the bit line openings;

wherein the first bit lines have a higher concentration of dopants compared to a concentration of dopants of the second bit lines and a lateral length of the first bit lines is smaller than a lateral length of the second bit lines, and the lateral length of the second bit lines is smaller than a lateral length of the third bit lines.

15. The memory device of claim 14, wherein the first bit line has a concentration of dopants of about $5E17$ atoms/cm$^3$ or more and about $1E21$ atoms/cm$^3$ or less and the second bit line has a concentration of dopants of about $1E16$ atoms/cm$^3$ or more and about $1E19$ atoms/cm$^3$ or less.

16. The memory device of claim 14, wherein the first bit line does not overlap with the poly gate in the lateral direction, but a portion of the second bit line overlaps with a portion of the poly gate in the lateral direction.

17. The memory device of claim 14, wherein the depth of the first line is greater than the depth of the second bit line.

18. The memory device of claim 14, wherein an effective channel length of the memory cell is about 70% or more and about 100% or less of a lateral length of the poly gate.

19. The memory device of claim 14 further comprising spacers adjacent side surfaces of the charge trapping dielectric stack and poly gate.

20. The memory device of claim 19, wherein the spacer comprises high temperature oxides.

* * * * *